United States Patent
Stille et al.

(10) Patent No.: US 12,043,902 B2
(45) Date of Patent: Jul. 23, 2024

(54) STEEL COMPONENT COMPRISING AN ANTI-CORROSION LAYER CONTAINING MANGANESE

(71) Applicant: ThyssenKrupp Steel Europe AG, Duisburg (DE)

(72) Inventors: Sebastian Stille, Dortmund (DE); Stefan Bienholz, Bochum (DE); Stefan Krebs, Dortmund (DE); Oliver Bendick, Herdecke (DE)

(73) Assignee: ThyssenKrupp Steel Europe AG, Duisburg (DE)

( * ) Notice: Subject to any disclaimer, the term of this patent is extended or adjusted under 35 U.S.C. 154(b) by 0 days.

(21) Appl. No.: 17/791,738

(22) PCT Filed: Jan. 15, 2021

(86) PCT No.: PCT/EP2021/050764
§ 371 (c)(1),
(2) Date: Jul. 8, 2022

(87) PCT Pub. No.: WO2021/148312
PCT Pub. Date: Jul. 29, 2021

(65) Prior Publication Data
US 2023/0047998 A1  Feb. 16, 2023

(30) Foreign Application Priority Data

Jan. 24, 2020 (EP) .................................. 20153507
Jan. 24, 2020 (EP) .................................. 20153508

(51) Int. Cl.
*C23C 30/00* (2006.01)
*B32B 15/01* (2006.01)
(Continued)

(52) U.S. Cl.
CPC ............ *C23C 30/005* (2013.01); *B32B 15/01* (2013.01); *B32B 15/011* (2013.01); *B32B 15/04* (2013.01);
(Continued)

(58) Field of Classification Search
CPC .. C23C 14/16; C23C 4/02; C23C 4/06; C23C 4/08; C23C 4/18; C23C 2/02; C23C 2/04;
(Continued)

(56) References Cited

U.S. PATENT DOCUMENTS 3,268,422 A  8/1966  Smith et al.
3,778,238 A * 12/1973 Tyler ..................... B32B 15/015
428/677

(Continued)

FOREIGN PATENT DOCUMENTS

| CN | 101263233 A | 9/2008 |
|---|---|---|
| CN | 103233212 A | 8/2013 |

(Continued)

OTHER PUBLICATIONS

International Search Report and Written Opinion for International Application No. PCT/EP2021/050764 mailed Feb. 11, 2021.

(Continued)

*Primary Examiner* — Michael E. La Villa
(74) *Attorney, Agent, or Firm* — RMCK Law Group PLC

(57) ABSTRACT

The invention relates to a steel component comprising a steel substrate having an anticorrosion coating present at least on one side of the steel substrate. This anticorrosion coating comprises a manganese-containing alloy layer. The manganese-containing alloy layer here forms the closest alloy layer of the anticorrosion coating to the surface. Moreover the manganese-containing alloy layer comprises iron and a further metal.

8 Claims, 3 Drawing Sheets

(51) Int. Cl.
| | |
|---|---|
| B32B 15/04 | (2006.01) |
| B32B 15/18 | (2006.01) |
| C21D 8/02 | (2006.01) |
| C21D 9/46 | (2006.01) |
| C22C 22/00 | (2006.01) |
| C22C 38/00 | (2006.01) |
| C22C 38/02 | (2006.01) |
| C22C 38/04 | (2006.01) |
| C22C 38/06 | (2006.01) |
| C22C 38/14 | (2006.01) |
| C22C 38/16 | (2006.01) |
| C22C 38/18 | (2006.01) |
| C22C 38/20 | (2006.01) |
| C22C 38/28 | (2006.01) |
| C23C 2/04 | (2006.01) |
| C23C 4/02 | (2006.01) |
| C23C 4/06 | (2016.01) |
| C23C 4/08 | (2016.01) |
| C23C 4/18 | (2006.01) |
| C23C 10/02 | (2006.01) |
| C23C 10/18 | (2006.01) |
| C23C 10/20 | (2006.01) |
| C23C 10/60 | (2006.01) |
| C23C 14/16 | (2006.01) |
| C23C 24/08 | (2006.01) |
| C23C 28/00 | (2006.01) |
| C23C 28/02 | (2006.01) |

(52) U.S. Cl.
CPC ............ *B32B 15/043* (2013.01); *B32B 15/18* (2013.01); *C21D 8/0205* (2013.01); *C21D 9/46* (2013.01); *C22C 22/00* (2013.01); *C22C 38/002* (2013.01); *C22C 38/008* (2013.01); *C22C 38/02* (2013.01); *C22C 38/04* (2013.01); *C22C 38/06* (2013.01); *C22C 38/14* (2013.01); *C22C 38/16* (2013.01); *C22C 38/18* (2013.01); *C22C 38/20* (2013.01); *C22C 38/28* (2013.01); *C23C 2/04* (2013.01); *C23C 4/02* (2013.01); *C23C 4/06* (2013.01); *C23C 4/08* (2013.01); *C23C 4/18* (2013.01); *C23C 10/02* (2013.01); *C23C 10/18* (2013.01); *C23C 10/20* (2013.01); *C23C 10/60* (2013.01); *C23C 14/16* (2013.01); *C23C 24/08* (2013.01); *C23C 28/021* (2013.01); *C23C 28/023* (2013.01); *C23C 28/32* (2013.01); *C23C 28/321* (2013.01); *C23C 28/322* (2013.01); *C23C 30/00* (2013.01); *C21D 2211/008* (2013.01); *Y10T 428/12729* (2015.01); *Y10T 428/12771* (2015.01); *Y10T 428/12806* (2015.01); *Y10T 428/12861* (2015.01); *Y10T 428/12951* (2015.01); *Y10T 428/12958* (2015.01); *Y10T 428/12972* (2015.01); *Y10T 428/26* (2015.01)

(58) Field of Classification Search
CPC ......... C23C 2/28; C23C 30/00; C23C 30/005; C23C 10/20; C23C 10/60; C23C 24/08; C23C 28/021; C23C 28/023; C23C 28/32; C23C 28/321; C23C 28/322; C21D 8/0205; C21D 9/46; C21D 2211/008; C22C 22/00; C22C 38/04; C22C 38/06; C22C 38/008; C22C 38/18; C22C 38/20; C22C 38/02; C22C 38/002; C22C 38/14; C22C 38/28; B32B 15/01; B32B 15/011; B32B 15/043; B32B 15/04; B32B 15/18; Y10T 428/12729; Y10T 428/12806; Y10T 428/12771; Y10T 428/12861; Y10T 428/12951; Y10T 428/12958; Y10T 428/12972; Y10T 428/26

See application file for complete search history.

(56) References Cited

U.S. PATENT DOCUMENTS

| | | | |
|---|---|---|---|
| 4,269,904 | A | 5/1981 | Ikeno et al. |
| 5,043,230 | A | 8/1991 | Jagannathan et al. |
| 5,082,748 | A | 1/1992 | Ahn et al. |
| 9,194,039 | B2 | 11/2015 | Hass et al. |
| 2001/0042393 | A1 | 11/2001 | Kefferstein et al. |
| 2014/0170438 | A1 | 6/2014 | Baumgart et al. |
| 2016/0215376 | A1 | 7/2016 | Luther et al. |
| 2016/0222484 | A1 | 8/2016 | Köyer et al. |
| 2017/0029955 | A1 | 2/2017 | Kim et al. |
| 2017/0145529 | A1* | 5/2017 | Schuhmacher ......... C22C 38/04 |
| 2017/0321314 | A1 | 11/2017 | Kolnberger et al. |

FOREIGN PATENT DOCUMENTS

| | | |
|---|---|---|
| CN | 103866363 A | 6/2014 |
| CN | 104789904 A | 7/2015 |
| CN | 105531385 A | 4/2016 |
| CN | 106795634 A | 5/2017 |
| CN | 110129777 A | 8/2019 |
| DE | 102014004652 A1 | 10/2015 |
| DE | 102017003234 A1 | 10/2018 |
| DE | 102017011553 A1 | 6/2019 |
| EP | 2224034 A1 | 9/2010 |
| EP | 2944710 A1 | 11/2015 |
| JP | H11350084 A | 12/1999 |
| JP | 2009203497 A | 9/2009 |
| RU | 2008141267 A | 4/2010 |
| WO | 2015027972 A1 | 3/2015 |
| WO | 2016071399 A1 | 5/2016 |

OTHER PUBLICATIONS

Common Knowledge Document—Corrosion of metals; electrochemical corrosion tests, DIN50918, Jun. 1978.
Chinese Office Action for CN Application No. 202180010920.X mailed Aug. 1, 2023.
Materials Protection, Oct. 2004, vol. 37, No. 10.
Notification of Decision to Grant for CN Application No. 202180010920 mailed Apr. 10, 2024.

* cited by examiner

STEEL COMPONENT COMPRISING AN ANTI-CORROSION LAYER CONTAINING MANGANESE

CROSS-REFERENCE TO RELATED APPLICATIONS

This application is a 371 U.S. National Stage of International Application No. PCT/EP2021/050764, filed Jan. 15, 2021, which claims the benefit of European Patent Application Nos. 20153507.7 filed Jan. 24, 2020 and 20153508.5 filed Jan. 24, 2020. The disclosures of each of the above applications are incorporated herein by reference in their entirety.

The invention relates to a steel component having a manganese-containing anticorrosion layer, to a flat steel product for producing such a steel component, and to processes for producing the steel component and the flat steel product, respectively.

References herein to "flat steel products" are to steel strips, steel sheets, or blanks and the like obtained from them.

In order to offer the combination of low weight, maximum strength, and protective effect that is required in modern-day bodywork construction, components hot-press-formed from high-strength steels are nowadays used in those areas of the bodywork that may be exposed to particularly high loads in the event of a crash.

In hot press hardening, also called hot forming, steel blanks divided off from cold-rolled or hot-rolled steel strip are heated to a deformation temperature, which is generally situated above the austenitization temperature of the respective steel, and are placed in the heated state into the die of a forming press. In the course of the forming that is subsequently carried out, the sheet blank or the component formed from it undergoes rapid cooling as a result of contact with the cool die. The cooling rates here are set so as to produce a hardened structure in the component. The structure is converted to a martensitic structure.

Typical steels suitable for hot press hardening are the steels A-E, their chemical composition being listed in table 5.

In practice, the advantages of the known manganese-boron steels which are particularly suitable for hot press hardening are counterbalanced by the disadvantage that, generally speaking, manganese-containing steels are unstable toward wet corrosion. This tendency, which is strong by comparison with less highly alloyed steels, on exposure to elevated chloride ion concentrations, toward corrosion which, while locally limited, is nevertheless intensive makes it difficult for steels belonging to the high-alloy steel sheet materials group to be used, particularly in bodywork construction. Manganese-containing steels, moreover, have a tendency toward surface corrosion, thereby likewise restricting the spectrum of their usefulness.

It is known from investigations, furthermore, that in the case of temperable Mn—B steels for complex, crash-critical structural components in vehicle bodies, under adverse conditions, as for example on increased hydrogen introduction and in the presence of elevated tensile stresses, during the fabrication or the further processing of these steels, there is potentially a risk of hydrogen embrittlement and/or of the incidence of delayed, hydrogen-induced cracking. The introduction of hydrogen is favored by the relatively high accommodation capacity of the steel substrate in the austenitic structural state during the annealing treatment.

A variety of proposals exist in the prior art aimed at reducing the hydrogen absorption of manganese-containing steels during the tempered state and/or else at providing such steels with a metallic coating that protects the steel from corrosive attack. Distinctions are made here between active and passive anticorrosion systems.

Active anticorrosion systems are produced typically by continuous application of a zinc-containing anticorrosion coating. Passive anticorrosion systems, in contrast, are produced customarily by application of an aluminum-containing coating, more particularly an aluminum-silicon coating (AlSi), which affords a good barrier effect to corrosive attacks.

The use of zinc-containing anticorrosion coatings, however, has the disadvantage that zinc, at around 419° C., has a relatively low melting point. In the course of hot forming, the liquid, zinc-containing coating then penetrates into the base material, where it leads to severe cracking (known as liquid-metal embrittlement).

With existing aluminum-containing anticorrosion coatings as well there are a number of adverse aspects. For instance, the energy consumption of a hot dip coating line for producing AlSi coatings is relatively high, owing to the high melting temperature of the coating material. Furthermore, on manganese-boron steels, these coatings can be cold-formed only to a certain extent. Because of a hard intermetallic Fe—Al—Si phase, the cold-forming operation is accompanied by instances of flaking of the coating. As a result, degrees of forming are restricted. In general, therefore, the AlSi coatings require direct hot forming. In combination with a cathodic electrodeposition coating, which allows the coating film to adhere well to the surface of the AlSi coating, a good barrier effect with respect to corrosive attacks can be achieved. With this coating variant, moreover, it is necessary to consider the introduction of hydrogen into the steel material, which may necessitate the use of dew point regulation in the continuous oven for the press hardening process if process conditions are adverse. The energy consumption associated with dew point regulation gives rise to additional costs in component manufacture.

US 2017/0029955 discloses a variety of coatings for hot forming, including manganese-containing alloy layers.

On this basis, the object of the invention was to provide an alternative coating which is suitable for hot forming and which provides the hot-formed steel component with sufficient protection from corrosion.

This object is achieved by means of a steel component comprising a steel substrate having an anticorrosion coating present at least on one side of the steel substrate. This anticorrosion coating comprises a manganese-containing alloy layer, with the manganese-containing alloy layer forming the closest alloy layer of the anticorrosion coating to the surface, and with the manganese-containing alloy layer comprising iron and a further metal.

For the purposes of this patent application, a layer is regarded as comprising or containing an element if the mass fraction of that element is greater than 0.5 wt %. The manganese-containing alloy layer therefore contains a mass fraction of manganese which is greater than 0.5 wt %, a mass fraction of iron which is greater than 0.5 wt %, and a mass fraction of a further metal which is likewise greater than 0.5 wt %.

Mass fractions are abbreviated below in a customary way with the element symbol, i.e.: Mn>0.5 wt % and Fe>0.5 wt %. The mass fraction of the further metal is abbreviated with X, unless the metal is specified. Therefore X>0.5 wt %.

In particular the object is achieved by a steel component comprising a steel substrate having an anticorrosion coating present at least on one side of the steel substrate. The anticorrosion coating here comprises a manganese-containing alloy layer, where the manganese-containing alloy layer forms the closest alloy layer of the anticorrosion coating to the surface and where the manganese-containing alloy layer comprises:
  manganese
  a further metal from the group of aluminum, chromium, copper, and tin
  optionally one or more alloy elements from the group of magnesium, calcium, strontium, zirconium, zinc, silicon, aluminum, chromium, copper, and tin, with the proviso that the total fraction of all the alloy elements from this group cumulatively is less than 2 wt %
  balance iron and unavoidable impurities.

Alternatively the object is also achieved by a specific embodiment of the steel component (referred to below as the Cu—Zn variant). In this case the steel component comprises a steel substrate having an anticorrosion coating present at least on one side of the steel substrate. The anticorrosion coating here comprises a manganese-containing alloy layer, where the manganese-containing alloy layer comprises:
  manganese
  a further metal from the group of copper and tin
  optionally one or more alloy elements from the group of magnesium, calcium, strontium, zirconium, zinc, silicon, aluminum, chromium, copper, and tin, with the proviso that the total fraction of all the alloy elements from this group cumulatively is less than 2 wt %
  balance iron and unavoidable impurities.

In one preferred development of the Cu—Zn variant, the manganese-containing alloy layer forms the closest alloy layer of the anticorrosion coating to the surface.

In a specific development of the Cu—Zn variant, the anticorrosion coating has at least one further functional layer which is arranged closer to the surface than the manganese-containing alloy layer.

The steel substrate of an above-described steel component is typically a steel with martensitic structure, preferably a manganese-boron steel with martensitic structure.

More preferably the steel substrate is a steel from the group of steels A-E, their chemical analysis being indicated in table 5. Table 5 here should be understood as indicating the element fractions in weight percent for each steel from the group of steels A-E. In this context a minimum and a maximum weight fraction are indicated. For example, therefore, the steel A comprises a carbon fraction C: 0.05 wt %-0.10 wt %. If the lower limit is zero, the element should be understood as being optional. No entry in the table means that there is no restriction for the element. For the elements chromium and molybdenum, in the case of the steels C-E, only an upper limit for the sum total of the element contents for chromium and molybdenum is provided. In addition to the elements listed in the table, the steels A-E may contain further, optional elements, e.g., Cu, N, Ni, V, Sn and/or Ca. The balance consists in each case of iron.

Surprisingly it has emerged that a ternary alloy system of this kind with iron and manganese exhibits a particularly good barrier effect to corrosion. The anticorrosion coating here also acts as a sacrificial or protective anode. Unlike the zinc-containing anticorrosion coatings mentioned at the outset, the anticorrosion coating of the invention has a relatively high melting point, and so it is highly suitable for hot forming and the liquid-metal embrittlement is significantly reduced.

In a preferred variant embodiment, the manganese-containing alloy layer contains more than 10 wt % manganese, more particularly more than 20 wt % manganese, preferably more than 30 wt %, more preferably more than 40 wt % manganese. This ensures firstly that the melting point of the alloy layer is sufficiently high and secondly that the active anticorrosion effect occurs. A high manganese fraction leads, additionally, to a darkening of the surface, owing to the formation of manganese oxide on the surface. This improves the energy consumption in the oven, leading in turn to energy savings.

In one specific embodiment of the steel component, the manganese-containing alloy layer contacts the steel substrate. The manganese-containing alloy layer is therefore also the only alloy layer in the anticorrosion coating, since it both is the closest alloy layer to the surface and contacts the steel substrate directly (in the case of the Cu—Zn variant, this is the case at least for one of the specific developments). In any event, the direct contacting of the steel substrate supports the action as a sacrificial anode in the context of the anticorrosion effect.

One developed variant of the steel component comprises an anticorrosion coating having an oxide layer on the surface of the anticorrosion coating. The oxide layer is formed spontaneously by reaction with atmospheric oxygen. Where the manganese-containing alloy layer is also the closest alloy layer to the surface, the oxide layer comprises substantially manganese oxide, oxides of the further metal and/or oxides of the optional alloy elements. Where a further functional layer is arranged closer to the surface than the manganese-containing alloy layer, the oxide layer comprises substantially oxides of the materials of the further functional layer. The thickness of the oxide layer is typically 20 nm to 300 nm, preferably 50 nm to 200 nm, and it provides the steel component with additional protection from corrosion.

In specific embodiments of the steel component, the electrochemical potential of the manganese-containing alloy layer is more negative than the electrochemical potential of the steel substrate. In this way the effect of the alloy layer as a sacrificial anode, and hence the active anticorrosion effect for the steel substrate, are achieved. More particularly here the amount of the difference between the electrochemical potentials of steel substrate and manganese-containing alloy layer is greater than 50 mV, more particularly greater than 100 mV, preferably 150 mV, more preferably greater than 200 mV. It has been found that a high difference between the electrochemical potentials leads to a particularly good active anticorrosion effect.

The electrochemical potential was determined according to DIN standard "DIN 50918 (section 3.1) (1978.06)" ("Measurement of resting potential on homogeneous mixed electrodes"). Where absolute values rather than differential values are indicated for the electrochemical potential below, the reference to the standard hydrogen electrode is meant.

The further metal of the manganese-containing alloy layer is selected from the group of aluminum, chromium, copper, and tin. Experiments have shown that ternary alloy systems composed of iron, manganese, and an element from the group of aluminum, chromium, copper, and tin are particularly suitable as anticorrosion systems. These elements, moreover, are comparatively nontoxic and to some extent favorably priced. The melting point, furthermore, is high enough to provide a sufficient reduction in the liquid-metal embrittlement during hot forming. All of these combinations, moreover, exhibit a good active anticorrosion effect.

The manganese-containing alloy layer optionally comprises one or more alloy elements from the group of magnesium, calcium, strontium, zirconium, zinc, silicon, aluminum, chromium, copper, and tin, with the proviso that the total fraction of all the alloy elements from this group cumulatively is less than 2 wt %. In contradistinction to the further metal from the group of aluminum, chromium, copper, and tin, the optional alloy elements may also be present in fractions less than 0.5 wt %.

The alloying-in of these elements has the advantage that they form oxides and that relatively little hydrogen is released in the course of their oxide formation with water vapor. In the course of the hot forming, therefore, relatively little hydrogen penetrates the manganese-containing alloy layer and the substrate. The alloying-in therefore protects against hydrogen embrittlement.

At the same time, with such a low level of alloying-in (cumulatively less than 2 wt %), the elements have only a very small influence, or none, on the electrochemical properties, in other words the cathodic protection. It is therefore also justified for the electrochemical investigations in exemplary embodiments to be carried out without this alloying-in.

In one preferred variant, the manganese-containing alloy layer contains no elements other than iron and the stated further metal. The mass fractions of all the other elements are therefore less than 0.5 wt %.

In specific embodiments the iron content of the manganese-containing alloy layer is more than 2.0 wt %, more particularly more than 3.0 wt %, preferably 5.0 wt %, more preferably 10.0 wt %. A certain fraction of iron diffuses into the alloy layer automatically during the hot forming.

In one specific embodiment, the manganese-containing alloy layer contains iron and aluminum, with the iron content being less than 24 wt %, more particularly less than 20 wt %, preferably less than 15 wt %, more preferably less than 12 wt %, and the manganese content being greater than 40 wt %. For the variant having an iron content of less than 12 wt % and a manganese content of greater than 40 wt % in particular, it has been found that the resulting electrochemical potential is less than −400 mV. For a steel substrate composed of a manganese-boron steel with an electrochemical potential of −250 mV, therefore, the manganese-containing alloy layer ensures a very good active anticorrosion effect.

The manganese-boron steels referenced with a martensitic structure, more particularly the steels A-E in accordance with table 5, have an electrochemical potential in the range of −250 mV±100 mV, depending on precise chemical composition. Illustratively, here and below, the advantages of the manganese-containing alloy layer are elucidated in interaction with a steel substrate whose steel has an electrochemical potential of −250 mV. For other steel substrates with a different chemical potential within the range of −250 mV±100 mV, corresponding comments apply.

In another specific embodiment, the manganese-containing alloy layer comprises iron and tin, with the iron content being less than 20 wt % and the tin content being less than 30 wt %, the tin content in this variant being preferably greater than 6 wt %. It has emerged that for manganese-containing alloy layers having this relative composition, there is an electrochemical potential which consequently is less than −250 mV, and so for the manganese-boron steel mentioned there is an active anticorrosion effect.

In another specific embodiment, the manganese-containing alloy layer comprises iron and copper, where the ratio of iron content to copper content is greater than 0.05. It has emerged that for manganese-containing alloy layers having this mass ratio, there is an electrochemical potential which consequently is less than −250 mV, and so for the manganese-boron steel mentioned there is an active anticorrosion effect.

In particular it has emerged that it is advantageous if the iron content Fe and copper content Cu fulfil the following relationship:

Fe<45 wt %−1.18 Cu

In this case the electrochemical potential indeed is consistently less than −500 mV, leading to a better active anticorrosion effect in conjunction with the aforementioned manganese-boron steel.

In one preferred variant the iron content Fe and copper content Cu also fulfil the following relationship:

Fe<20 wt %−0.66 Cu

In this case the electrochemical potential indeed is consistently less than −650 mV, leading to an even better active anticorrosion effect in conjunction with the aforementioned manganese-boron steel.

In a further specific embodiment, the manganese-containing alloy layer comprises iron and chromium, with the iron content Fe and the chromium content Cr fulfilling the following relationship:

20 wt %<Fe+Cr<50 wt %

In this range, the electrochemical potential is consistently less than −350 mV, so leading to a very good active anticorrosion effect in conjunction with the aforementioned manganese-boron steel.

The steel component is more particularly developed such that the manganese-containing alloy layer is in the solid state at a temperature of 880° C. to an extent at least of 70 vol %, preferably of at least 80 vol %. The effect of this is that hot forming is uncomplicatedly possible, without any adhesion of the liquefied layer to dies or tools and without any liquid-metal embrittlement.

The aforementioned steel component is more particularly a press-hardened steel component, preferably a steel component of a motor vehicle, preferably selected from the group consisting of bumper cross-beam, side impact beam, columns, and bodywork reinforcements.

The object of the invention is likewise achieved by a flat steel product for producing an above-described steel component. The flat steel product here comprises a steel substrate having an anticorrosion coating present at least on one side of the steel substrate, where the anticorrosion coating comprises a manganese-containing alloy layer and where the manganese-containing alloy layer forms the closest alloy layer of the anticorrosion coating to the surface. The manganese-containing alloy layer comprises:
- manganese
- a further metal from the group of aluminum, chromium, copper, and tin
- optionally one or more alloy elements from the group of magnesium, calcium, strontium, zirconium, zinc, silicon, aluminum, chromium, copper, and tin, with the proviso that the total fraction of all the alloy elements from this group cumulatively is less than 2 wt %
- balance iron and unavoidable impurities.

Alternatively the object is also achieved by a specific embodiment of the flat steel product (referred to below as Cu—Zn variant). The flat steel product here comprises a steel substrate having an anticorrosion coating present at least on one side of the steel substrate, where the anticorrosion coating comprises a manganese-containing alloy layer. The manganese-containing alloy layer comprises:

manganese a further metal from the group of copper and tin optionally one or more alloy elements from the group of magnesium, calcium, strontium, zirconium, zinc, silicon, aluminum, chromium, copper, and tin, with the proviso that the total fraction of all the alloy elements from this group cumulatively is less than 2 wt % balance iron and unavoidable impurities.

In one preferred development of the Cu—Zn variant, the manganese-containing alloy layer forms the closest alloy layer of the anticorrosion coating to the surface. The direct contacting of the steel substrate supports the sacrificial anode effect in the anticorrosion function.

In one specific development of the Cu—Zn variant, the anticorrosion coating has at least one further functional layer, which is arranged closer to the surface than the manganese-containing alloy layer.

The flat steel product may be used more particularly for producing an above-described steel component. The flat steel product therefore has the corresponding advantages elucidated above in connection with the steel component.

The manganese-containing alloy layer of the flat steel product may already have an iron fraction. In that case, however, this fraction is typically lower by several percentage points than in the hot-formed steel component. Alternatively the manganese-containing alloy layer of the flat steel product may also contain no iron. In both cases there is an increase in the iron fraction during hot forming, since iron diffuses from the steel substrate into the manganese-containing alloy layer. The exact iron fraction diffusing into the manganese-containing alloy layer can be controlled through the process parameters during hot forming. The higher the temperature during the hot forming and the longer the flat steel product is held at this temperature, the greater the amount of iron diffusing into the manganese-containing alloy layer.

In one preferred variant embodiment, the manganese-containing alloy layer of the flat steel product contains more than 10 wt % manganese, more particularly more than 20 wt % manganese, preferably more than 30 wt %, more preferably more than 40 wt % manganese, more particularly more than 50 wt % manganese. This ensures on the one hand that the melting point of the alloy layer is sufficiently high. On the other hand it ensures that the manganese content is also sufficiently high after the hot forming to ensure the active anticorrosion effect.

In one specific embodiment of the flat steel product, the manganese-containing alloy layer contacts the steel substrate. The manganese-containing alloy layer is therefore also the only alloy layer in the anticorrosion coating, as it directly contacts not only the closest alloy layer to the surface but also the steel substrate (in the case of the Cu—Zn variant, this is the case at least for one of the specific developments). In any event the direct contacting of the steel substrate supports the sacrificial anode effect in the anticorrosion function.

In one development of the flat steel product, the steel substrate is a steel with ferritic-pearlitic structure, preferably a manganese-boron steel with ferritic-pearlitic structure, more preferably a manganese-boron steel with ferritic-pearlitic structure that is convertible to a martensitic structure by heat treatment in the form of a thermal hardening treatment. As a result, the steel substrate is particularly suitable for the production of an above-elucidated steel component by hot forming.

The object of the invention is likewise achieved by a process for producing an aforesaid flat steel product. The process here comprises at least the following steps:— producing or providing a steel substrate, the structure of the steel substrate being convertible to a martensitic structure by hot forming, applying a manganese-containing alloy layer to form an anticorrosion coating, where the manganese-containing alloy layer comprises:

i. manganese ii. a further metal from the group of aluminum, chromium, copper, and tin iii. optionally one or more alloy elements from the group of magnesium, calcium, strontium, zirconium, zinc, silicon, aluminum, chromium, copper, tin, and iron, with the proviso that the total fraction of all of the alloy elements from this group cumulatively is less than 2 wt % iv. balance iron and unavoidable impurities and where the manganese-containing alloy layer (19) forms the closest alloy layer of the anticorrosion coating to the surface.

Alternatively the object of the invention is achieved by a specific embodiment of the process for producing an aforesaid flat steel product (Cu—Zn variant). The process in this case comprises at least the following steps:

producing or providing a steel substrate, the structure of the steel substrate being convertible to a martensitic structure by hot forming, applying a manganese-containing alloy layer to form an anticorrosion coating, where the manganese-containing alloy layer comprises:

i. manganese ii. a further metal from the group of copper and tin iii. optionally one or more alloy elements from the group of magnesium, calcium, strontium, zirconium, zinc, silicon, aluminum, chromium, copper, tin, and iron, with the proviso that the total fraction of all of the alloy elements from this group cumulatively is less than 2 wt % iv. balance iron and unavoidable impurities.

The processes here have the same advantages elucidated above in relation to the flat steel products and to the steel components, respectively.

The production process is developed more particularly such that the applying of the manganese-containing alloy layer takes place by means of a process selected from the group consisting of electrolytic deposition, physical vapor deposition (PVD), dip processes, chemical vapor deposition, slurry processes, thermal spraying, roll bonding, and combinations thereof.

For the stated manganese-containing alloy layer, physical vapor deposition is particularly advantageous, since in this process no hydrogen is introduced into the substrate. The PVD process, moreover, enables coating with high-melting alloys, which is not so simple in the hot dip process, for example.

The object of the invention is likewise achieved by a process for producing an aforesaid steel component. The process for producing a steel component here comprises at least the following steps:

providing an above-elucidated flat steel product or producing an above-elucidated flat steel product, more particularly by the process described above, hot-forming the flat steel product provided or produced, to give the steel component.

The hot forming of the flat steel product provided or produced is preferably configured such that it comprises the following steps:

heating the flat steel product in an oven with an oven temperature of 830° C. to 980° C., preferably 830° C. to 910° C., the residence time of the flat steel product in the oven being at least 1 and at most 18 minutes discharging the flat steel product from the oven and inserting it in a forming die forming the flat steel product into a steel component in the forming die.

In order to avoid substantial heat losses, the transfer time between oven and forming die is typically at most 10 seconds.

The flat steel product may optionally be cooled in the forming die during forming at cooling rates of 20-1000 K/s, preferably 25-500 K/s, to harden the steel substrate.

Alternatively the flat steel product may first be formed into a steel component in the forming die, after which the steel component can be cooled at cooling rates of 20-1000 K/s, preferably 25-500 K/s, to harden the steel substrate.

The flat steel product is typically inserted into the oven at room temperature, and so the residence time t may comprise both a heating phase and a holding phase at the oven temperature.

The process for producing a steel component is developed more particularly such that the flat steel product provided or produced comprises as steel substrate a steel having a structure which can be converted to a martensitic structure by a heat treatment, preferably a steel with ferritic-pearlitic structure, more preferably a manganese-boron steel with ferritic-pearlitic structure, and the hot forming comprises:

a thermal hardening treatment wherein the structure is converted to a martensitic structure, and preferably a mechanical treatment, preferably a mechanical forming, before, during and/or after the thermal hardening treatment.

The aforesaid production process for a steel component is developed more particularly such that during the hot forming, iron diffuses from the steel substrate into the manganese-containing alloy layer, to give a manganese-containing alloy layer comprising a further metal from the group of aluminum, chromium, copper, and tin, and also, optionally, one or more alloy elements from the group of magnesium, calcium, strontium, zirconium, zinc, silicon, aluminum, chromium, copper, and tin, with the proviso that the total fraction of all the alloy elements from this group cumulatively is less than 2 wt %, and where the balance comprises iron and unavoidable impurities. More particularly in this case the electrochemical potential of the manganese-containing alloy layer is more negative than the electrochemical potential of the steel substrate, and more particularly the amount of the difference between the electrochemical potentials of steel substrate and manganese-containing alloy layer is greater than 50 mV, more particularly greater than 100 mV, preferably 150 mV, more preferably greater than 200 mV.

The aforesaid production process for a steel component is developed more particularly such that the hot forming comprises at least the following steps:

a thermal treating wherein the structure of the component provided or produced is held at a temperature above Ac3 until the structure has converted completely or partially to an austenitic structure, mechanical forming of the component, before, during and/or after the thermal treating, cooling the component from the temperature above Ac3, during and/or after the mechanical forming, preferably to a temperature of less than 100° C., to give a martensitic structure, preferably at a cooling rate >20 K/s.

The invention is elucidated in more detail with the figures, in which

Figure 1:
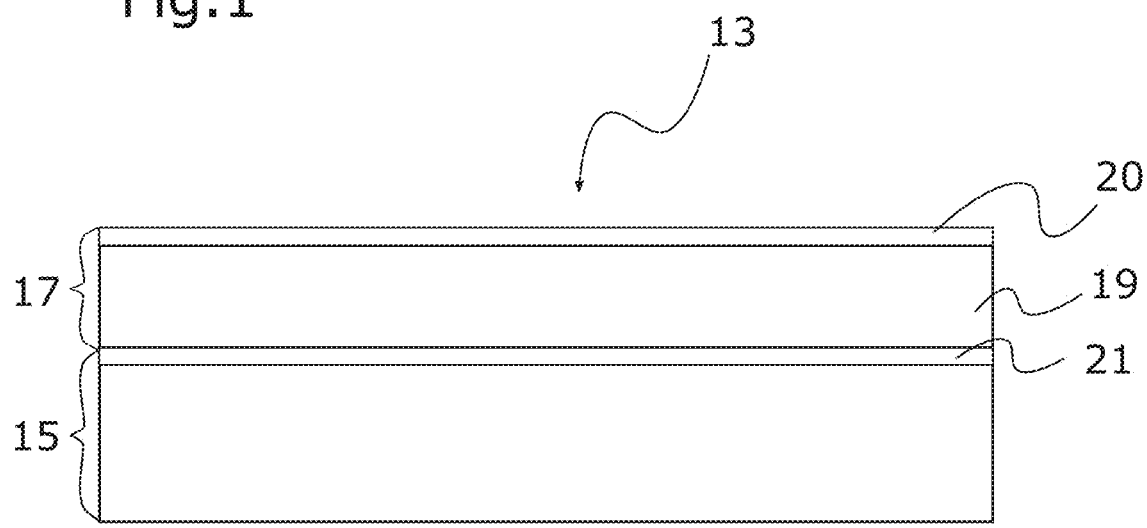
FIG. 1 shows a schematic representation of a steel component having an anticorrosion coating.

FIG. 1 shows a schematic representation of a steel component 13. The steel component 13 comprises a steel substrate 15 and an anticorrosion coating 17. The anticorrosion coating 17 comprises a manganese-containing alloy layer 19. The manganese-containing alloy layer 19 is the closest alloy layer of the anticorrosion coating 17 to the surface. Additionally the manganese-containing alloy layer 19 contacts the steel substrate 15. The manganese-containing alloy layer is therefore the only alloy layer of the anticorrosion coating 17.

The anticorrosion coating 17 further comprises an oxide layer 20 at the surface of the anticorrosion coating 17. The oxide layer 20 is formed spontaneously by reaction with atmospheric oxygen and comprises substantially manganese oxide and oxides of the further metal.

In the region of contact with the anticorrosion coating 17, the steel substrate 15 has developed a ferrite seam 21. The ferrite seam 21 comprises a diffusion layer having a high iron content and a thickness of between 1 μm and 6 μm, it being possible for this layer to form in the course of the hot forming. For the purposes of this patent application, the ferrite seam 21 is considered part of the steel substrate 15. According to the embodiment of the process parameters during the hot forming, the thickness of the ferrite seam 21 may vary or there may also be no ferrite seam 21 present.

Figure 2:
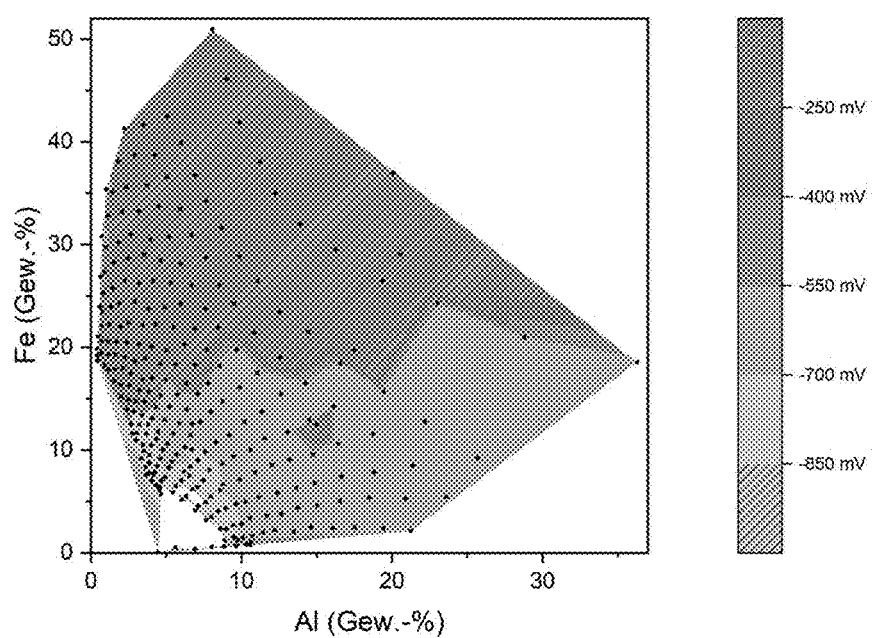
FIG. 2 shows the electrochemical potential of a manganese-containing alloy layer which comprises aluminum.

FIG. 2 shows the electrochemical potential of a manganese-containing alloy layer which comprises aluminum. In a grayscale representation, the electrochemical potential is shown as a function of the aluminum content and of the iron content. The remaining mass fraction is formed by manganese in each case. The measured values underlying the figure are set out in table 1.

Figure 3:
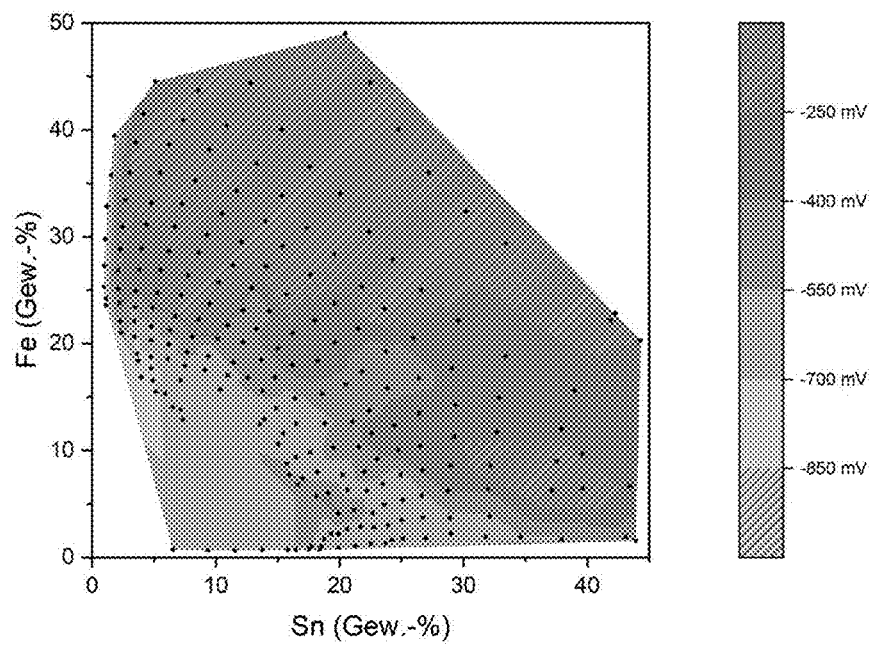
FIG. 3 shows the electrochemical potential of a manganese-containing alloy layer which comprises tin.

FIG. 3 shows the electrochemical potential of a manganese-containing alloy layer which comprises tin. In a grayscale representation, the electrochemical potential is shown as a function of the tin content and of the iron content. The remaining mass fraction is formed by manganese in each case. The measured values underlying the figure are set out in table 2.

Figure 4:
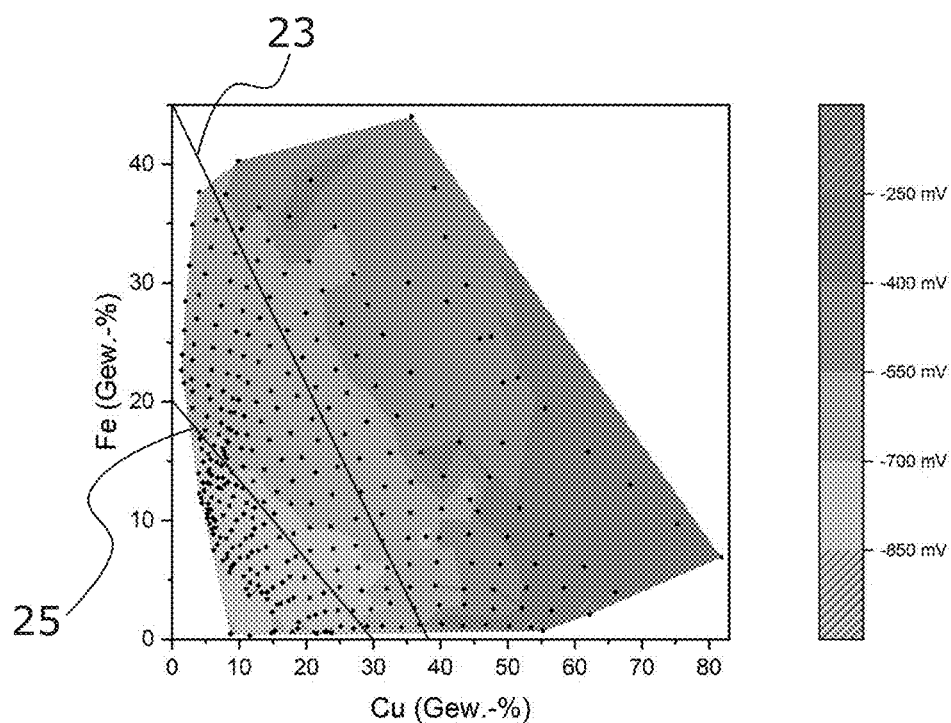
FIG. 4 shows the electrochemical potential of a manganese-containing alloy layer which comprises copper.

FIG. 4 shows the electrochemical potential of a manganese-containing alloy layer which comprises copper. In a grayscale representation, the electrochemical potential is shown as a function of the copper content and of the iron content. The remaining mass fraction is formed by manganese in each case. The measured values underlying the figure are set out in table 3. The reference numeral 23 denotes a line which indicates the border of the range Fe<45 wt %−1.18 Cu.

The points on the left below the line 23 therefore fulfil this relationship. Correspondingly the reference numeral 25 denotes a line which indicates the border of the range Fe<20 wt %−0.66 Cu.

Figure 5:
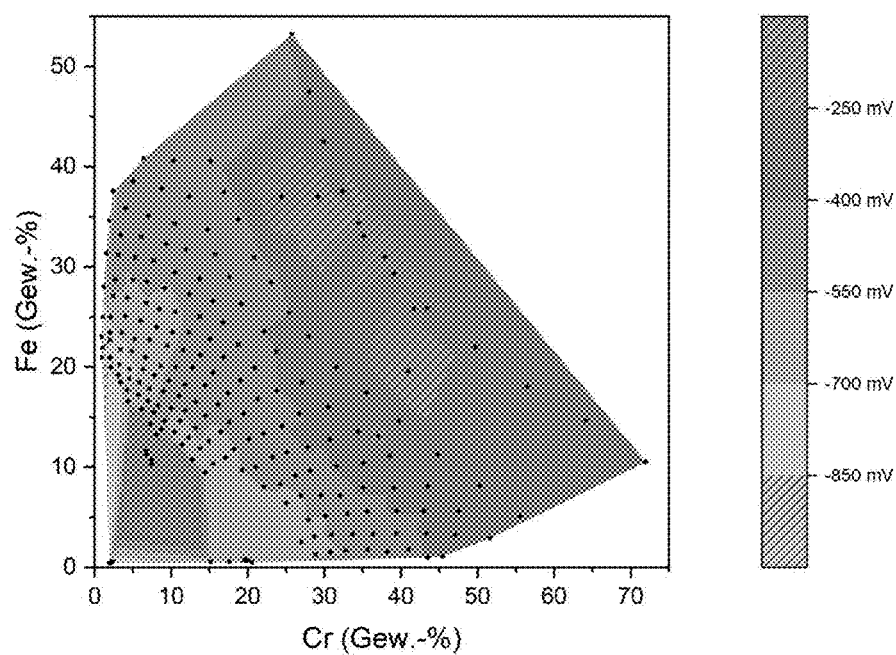
FIG. 5 shows the electrochemical potential of a manganese-containing alloy layer which comprises chromium.

FIG. 5 shows the electrochemical potential of a manganese-containing alloy layer which comprises chromium. In a grayscale representation, the electrochemical potential is shown as a function of the chromium content and of the iron content. The remaining mass fraction is formed by manganese in each case. The measured values underlying the figure are set out in table 4.

TABLE 1

| Sample No. | Al [wt %] | Fe [wt %] | Mn [wt %] | Electrochemical potential [mV] |
|---|---|---|---|---|
| 1 | 36.3 | 18.5 | 45.2 | −587 |
| 2 | 28.8 | 21 | 50.2 | −550 |
| 3 | 23.1 | 24.3 | 52.7 | −550 |
| 4 | 19.4 | 26.5 | 54.1 | 536 |
| 5 | 16.3 | 29.5 | 54.2 | 536 |
| 6 | 13.9 | 32 | 54.1 | 534 |
| 7 | 12.3 | 35 | 52.7 | 534 |
| 8 | 11.3 | 38.1 | 50.7 | 482 |
| 9 | 9.9 | 41.8 | 48.3 | 482 |
| 10 | 9 | 46.1 | 44.9 | 307 |
| 11 | 8.1 | 51 | 41 | 307 |
| 12 | 25.7 | 9.2 | 65.1 | −621 |
| 13 | 22.2 | 12.8 | 65.1 | −621 |
| 14 | 19.4 | 15.7 | 64.9 | −587 |
| 15 | 16.5 | 18.4 | 65.1 | −587 |
| 16 | 14.4 | 21.5 | 64 | 45 |
| 17 | 12.5 | 23.4 | 64.1 | 45 |
| 18 | 11.1 | 26.4 | 62.5 | 540 |
| 19 | 9.9 | 28.8 | 61.3 | 540 |
| 20 | 8.7 | 31.6 | 59.7 | 524 |
| 21 | 7.7 | 34.3 | 58 | 524 |
| 22 | 6.9 | 36.8 | 56.3 | 506 |
| 23 | 6 | 39.9 | 54.2 | 506 |
| 24 | 5 | 42.5 | 52.5 | 290 |
| 25 | 23.6 | 5.4 | 71 | −620 |
| 26 | 21.4 | 8.5 | 70.1 | −621 |
| 27 | 18.8 | 11.6 | 69.7 | −621 |
| 28 | 16.1 | 14.2 | 69.6 | −587 |
| 29 | 14.3 | 16.5 | 69.2 | −587 |
| 30 | 12.6 | 19 | 68.4 | 45 |
| 31 | 10.9 | 21.4 | 67.7 | 45 |
| 32 | 9.5 | 24.3 | 66.2 | 540 |
| 33 | 8.6 | 26 | 65.4 | 540 |
| 34 | 7.6 | 28.7 | 63.6 | 524 |
| 35 | 6.7 | 30.9 | 62.4 | 524 |
| 36 | 5.9 | 33.4 | 60.6 | 506 |
| 37 | 5 | 36.6 | 58.4 | 506 |
| 38 | 4.3 | 38.7 | 57 | 290 |
| 39 | 3.5 | 41.6 | 54.9 | 290 |
| 40 | 21.3 | 2.1 | 76.6 | −634 |
| 41 | 20.9 | 5.3 | 73.8 | −634 |
| 42 | 18.8 | 7.9 | 73.3 | −659 |
| 43 | 16.4 | 10.6 | 73 | −659 |
| 44 | 14.5 | 12.9 | 72.6 | −650 |
| 45 | 12.7 | 15.4 | 71.9 | −650 |
| 46 | 11 | 17.5 | 71.5 | −626 |
| 47 | 9.7 | 19.8 | 70.5 | −626 |
| 48 | 8.4 | 21.9 | 69.7 | −208 |
| 49 | 7.6 | 23.7 | 68.6 | −208 |
| 50 | 6.7 | 26.1 | 67.2 | 514 |
| 51 | 5.9 | 28.1 | 66 | 514 |
| 52 | 5.2 | 30.8 | 64.1 | 490 |
| 53 | 4.5 | 33.7 | 61.8 | 490 |
| 54 | 3.7 | 35.7 | 60.5 | 422 |
| 55 | 2.9 | 38.7 | 58.4 | 422 |
| 56 | 2.2 | 41.3 | 56.5 | 274 |
| 57 | 19.4 | 2.4 | 78.2 | −634 |
| 58 | 18.5 | 5.4 | 76.1 | −634 |
| 59 | 16.6 | 7.4 | 76 | −659 |
| 60 | 14.8 | 9.5 | 75.7 | −659 |
| 61 | 13.1 | 11.8 | 75.2 | −650 |

TABLE 1-continued

| Sample No. | Al [wt %] | Fe [wt %] | Mn [wt %] | Electrochemical potential [mV] |
|---|---|---|---|---|
| 62 | 11.3 | 13.7 | 74.9 | −650 |
| 63 | 9.9 | 16.1 | 74 | −626 |
| 64 | 8.6 | 18.2 | 73.2 | −626 |
| 65 | 7.7 | 19.8 | 72.5 | −208 |
| 66 | 6.9 | 21.8 | 71.3 | −208 |
| 67 | 6 | 24.2 | 69.8 | 514 |
| 68 | 5.3 | 26.3 | 68.4 | 514 |
| 69 | 4.6 | 28.4 | 66.9 | 490 |
| 70 | 3.9 | 30.5 | 65.6 | 490 |
| 71 | 3.2 | 33.3 | 63.6 | 422 |
| 72 | 2.4 | 35.6 | 62 | 422 |
| 73 | 1.8 | 38.1 | 60.1 | 274 |
| 74 | 9.8 | 1.3 | 89 | −448 |
| 75 | 17.5 | 2.5 | 80 | −645 |
| 76 | 16.5 | 5 | 78.4 | −645 |
| 77 | 14.9 | 6.8 | 78.3 | −668 |
| 78 | 13.2 | 9.1 | 77.7 | −668 |
| 79 | 11.5 | 11.2 | 77.3 | −678 |
| 80 | 10.2 | 12.8 | 77 | −678 |
| 81 | 8.8 | 14.7 | 76.5 | −621 |
| 82 | 7.8 | 16.5 | 75.7 | −621 |
| 83 | 6.9 | 18.3 | 74.8 | 272 |
| 84 | 6.2 | 20.3 | 73.5 | 272 |
| 85 | 5.5 | 21.9 | 72.5 | 221 |
| 86 | 4.9 | 23.9 | 71.2 | 221 |
| 87 | 4.2 | 26.5 | 69.3 | 496 |
| 88 | 3.6 | 29 | 67.5 | 496 |
| 89 | 2.7 | 31 | 66.4 | 442 |
| 90 | 2.1 | 33.2 | 64.8 | 442 |
| 91 | 1.5 | 35.1 | 63.5 | 378 |
| 92 | 1 | 35.4 | 63.6 | −893 |
| 93 | 10.6 | 0.8 | 88.6 | −448 |
| 94 | 16.1 | 2.4 | 81.5 | −645 |
| 95 | 15 | 4.6 | 80.4 | −645 |
| 96 | 13.6 | 6.3 | 80 | −668 |
| 97 | 12 | 8.5 | 79.4 | −668 |
| 98 | 10.6 | 10 | 79.4 | −678 |
| 99 | 9.2 | 11.4 | 79.4 | −678 |
| 100 | 8 | 13.7 | 78.3 | −621 |
| 101 | 7.1 | 15.4 | 77.5 | −621 |
| 102 | 6.3 | 16.5 | 77.2 | 272 |
| 103 | 5.6 | 18.4 | 76 | 272 |
| 104 | 5 | 19.7 | 75.3 | 221 |
| 105 | 4.3 | 22.3 | 73.4 | 221 |
| 106 | 3.8 | 23.8 | 72.4 | 496 |
| 107 | 3.2 | 26.2 | 70.6 | 496 |
| 108 | 2.5 | 28.6 | 68.9 | 442 |
| 109 | 1.8 | 30.2 | 68 | 442 |
| 110 | 1.1 | 32.8 | 66 | 378 |
| 111 | 0.7 | 30.8 | 68.5 | −893 |
| 112 | 10.6 | 1.1 | 88.3 | −443 |
| 113 | 14.6 | 2.4 | 82.9 | −661 |
| 114 | 13.7 | 4.4 | 81.9 | −661 |
| 115 | 12.4 | 5.9 | 81.8 | −684 |
| 116 | 10.9 | 7.8 | 81.2 | −684 |
| 117 | 9.5 | 9.4 | 81.1 | −691 |
| 118 | 8.3 | 10.8 | 80.9 | −691 |
| 119 | 7.3 | 12.8 | 80 | −591 |
| 120 | 6.4 | 14 | 79.7 | −591 |
| 121 | 5.7 | 15.4 | 78.9 | −685 |
| 122 | 5 | 16.9 | 78.2 | −685 |
| 123 | 4.6 | 18.4 | 77 | 534 |
| 124 | 4 | 20.1 | 75.9 | 534 |
| 125 | 3.4 | 22.1 | 74.4 | 514 |
| 126 | 2.9 | 24.4 | 72.7 | 514 |
| 127 | 2.2 | 26.5 | 71.3 | 482 |
| 128 | 1.6 | 28.3 | 70.2 | 482 |
| 129 | 1 | 29.7 | 69.3 | 417 |
| 130 | 0.6 | 26.8 | 72.5 | −833 |
| 131 | 10.3 | 0.8 | 88.8 | −443 |
| 132 | 13.5 | 2 | 84.5 | −661 |
| 133 | 12.7 | 3.8 | 83.6 | −661 |
| 134 | 11.1 | 5.4 | 83.5 | −684 |
| 135 | 9.9 | 7.1 | 83 | −684 |
| 136 | 8.8 | 8.7 | 82.6 | −691 |
| 137 | 7.6 | 9.9 | 82.5 | −691 |
| 138 | 6.6 | 11.5 | 81.9 | −591 |

TABLE 1-continued

| Sample No. | Al [wt %] | Fe [wt %] | Mn [wt %] | Electrochemical potential [mV] |
|---|---|---|---|---|
| 139 | 5.9 | 12.6 | 81.6 | −591 |
| 140 | 5.2 | 14.2 | 80.6 | −685 |
| 141 | 4.7 | 15.3 | 80 | −685 |
| 142 | 4.1 | 17 | 78.9 | 534 |
| 143 | 3.6 | 18.9 | 77.5 | 534 |
| 144 | 3.2 | 20.3 | 76.5 | 514 |
| 145 | 2.5 | 22.4 | 75.1 | 514 |
| 146 | 1.9 | 24.3 | 73.8 | 482 |
| 147 | 1.5 | 25.8 | 72.8 | 482 |
| 148 | 0.9 | 27.3 | 71.8 | 417 |
| 149 | 0.6 | 23.9 | 75.5 | −833 |
| 150 | 9.7 | 0.7 | 89.7 | −471 |
| 151 | 12.2 | 2.2 | 85.6 | −681 |
| 152 | 11.7 | 3.6 | 84.7 | −681 |
| 153 | 10.3 | 5 | 84.8 | −700 |
| 154 | 8.8 | 6.7 | 84.5 | −700 |
| 155 | 7.9 | 8.1 | 84 | −719 |
| 156 | 7.1 | 9 | 83.9 | −719 |
| 157 | 6.2 | 10.3 | 83.5 | −645 |
| 158 | 5.5 | 11.6 | 82.9 | −645 |
| 159 | 4.9 | 13 | 82.1 | −689 |
| 160 | 4.3 | 14.1 | 81.5 | −689 |
| 161 | 3.9 | 15.6 | 80.5 | 544 |
| 162 | 3.4 | 16.9 | 79.7 | 544 |
| 163 | 2.9 | 18.6 | 78.4 | 532 |
| 164 | 2.4 | 20.5 | 77.1 | 532 |
| 165 | 2 | 22 | 76 | 513 |
| 166 | 1.3 | 23.9 | 74.8 | 513 |
| 167 | 0.8 | 25.3 | 73.8 | 411 |
| 168 | 0.5 | 21 | 78.5 | −780 |
| 169 | 8.9 | 0.6 | 90.5 | −471 |
| 170 | 11.4 | 2 | 86.6 | −681 |
| 171 | 10.6 | 3.4 | 86.1 | −681 |
| 172 | 9.6 | 4.7 | 85.6 | −700 |
| 173 | 8.6 | 6.1 | 85.3 | −700 |
| 174 | 7.5 | 7.1 | 85.5 | −719 |
| 175 | 6.6 | 8.4 | 85 | −719 |
| 176 | 5.7 | 9.6 | 84.7 | −645 |
| 177 | 5.1 | 10.6 | 84.3 | −645 |
| 178 | 4.5 | 11.8 | 83.8 | −689 |
| 179 | 4.1 | 13.1 | 82.8 | −689 |
| 180 | 3.6 | 14.7 | 81.8 | 544 |
| 181 | 3.2 | 15.9 | 80.9 | 544 |
| 182 | 2.7 | 17.4 | 79.9 | 532 |
| 183 | 2.2 | 19.1 | 78.7 | 532 |
| 184 | 1.7 | 20.5 | 77.7 | 513 |
| 185 | 1.2 | 22.2 | 76.5 | 513 |
| 186 | 0.8 | 23.5 | 75.7 | 411 |
| 187 | 0.4 | 19.9 | 79.7 | −780 |
| 188 | 8 | 0.6 | 91.4 | −647 |
| 189 | 10.7 | 1.6 | 87.7 | −699 |
| 190 | 10 | 2.8 | 87.1 | −699 |
| 191 | 9 | 4.3 | 86.7 | −720 |
| 192 | 8 | 5.5 | 86.5 | −720 |
| 193 | 7.1 | 6.4 | 86.5 | −733 |
| 194 | 6.2 | 7.9 | 85.9 | −733 |
| 195 | 5.4 | 8.9 | 85.8 | −686 |
| 196 | 4.8 | 10 | 85.2 | −686 |
| 197 | 4.4 | 11.1 | 84.6 | −714 |
| 198 | 3.8 | 12.5 | 83.7 | −714 |
| 199 | 3.4 | 13.4 | 83.2 | −737 |
| 200 | 3 | 14.7 | 82.3 | −737 |
| 201 | 2.6 | 16.3 | 81.1 | 539 |
| 202 | 2.1 | 18 | 79.9 | 539 |
| 203 | 1.6 | 19.3 | 79.1 | 503 |
| 204 | 1.1 | 20.5 | 78.3 | 503 |
| 205 | 0.7 | 22.1 | 77.2 | 294 |
| 206 | 0.4 | 19.2 | 80.4 | −792 |
| 207 | 6.9 | 0.4 | 92.7 | −647 |
| 208 | 10.1 | 1.5 | 88.4 | −699 |
| 209 | 9.5 | 2.7 | 87.8 | −699 |
| 210 | 8.5 | 4.1 | 87.5 | −720 |
| 211 | 7.6 | 4.9 | 87.4 | −720 |
| 212 | 6.7 | 6.2 | 87.1 | −733 |
| 213 | 6 | 7 | 86.9 | −733 |
| 214 | 5.2 | 8.3 | 86.5 | −686 |
| 215 | 4.6 | 9.2 | 86.2 | −686 |
| 216 | 4 | 10.5 | 85.5 | −714 |
| 217 | 3.7 | 11.6 | 84.7 | −714 |
| 218 | 3.2 | 12.5 | 84.3 | −737 |
| 219 | 2.8 | 13.8 | 83.4 | −737 |
| 220 | 2.5 | 14.9 | 82.6 | 539 |
| 221 | 2 | 16.3 | 81.7 | 539 |
| 222 | 1.6 | 17.9 | 80.5 | 503 |
| 223 | 1.2 | 19.3 | 79.5 | 503 |
| 224 | 0.7 | 20.6 | 78.7 | 294 |
| 225 | 0.4 | 18.7 | 80.9 | −792 |
| 226 | 5.6 | 0.5 | 93.9 | −565 |
| 227 | 9.5 | 1.5 | 89 | −720 |
| 228 | 9 | 2.3 | 88.7 | −720 |
| 229 | 8 | 3.5 | 88.5 | −739 |
| 230 | 7.1 | 4.6 | 88.3 | −739 |
| 231 | 6.3 | 5.5 | 88.2 | −751 |
| 232 | 5.6 | 6.5 | 87.9 | −751 |
| 233 | 4.9 | 7.4 | 87.7 | −746 |
| 234 | 4.4 | 8.4 | 87.2 | −746 |
| 235 | 3.9 | 9.5 | 86.6 | −727 |
| 236 | 3.5 | 10.5 | 86 | −727 |
| 237 | 3 | 11.6 | 85.3 | −722 |
| 238 | 2.7 | 12.5 | 84.8 | −722 |
| 239 | 2.4 | 13.9 | 83.6 | 499 |
| 240 | 2 | 15.2 | 82.8 | 499 |
| 241 | 1.6 | 16.7 | 81.7 | 507 |
| 242 | 1.2 | 17.8 | 81 | 507 |
| 243 | 0.7 | 19.4 | 79.8 | −375 |
| 244 | 4.5 | 0 | 95.5 | −565 |
| 245 | 8.9 | 1.2 | 89.9 | −720 |
| 246 | 8.6 | 2.3 | 89 | −720 |
| 247 | 7.7 | 3.2 | 89.1 | −739 |
| 248 | 6.9 | 4.1 | 88.9 | −739 |
| 249 | 6 | 5.2 | 88.8 | −751 |
| 250 | 5.5 | 5.9 | 88.7 | −751 |
| 251 | 4.7 | 7 | 88.3 | −746 |
| 252 | 4.2 | 7.8 | 87.9 | −746 |
| 253 | 3.9 | 8.7 | 87.4 | −727 |
| 254 | 3.5 | 9.9 | 86.5 | −727 |
| 255 | 3 | 10.9 | 86.1 | −722 |
| 256 | 2.8 | 11.6 | 85.7 | −722 |
| 257 | 0.9 | 18.3 | 80.8 | −375 |
| 258 | 4.6 | 6.4 | 89 | −738 |
| 259 | 4.2 | 7.6 | 88.3 | −738 |
| 260 | 3.6 | 8.3 | 88 | −745 |
| 261 | 3.3 | 9.2 | 87.5 | −745 |
| 262 | 4.6 | 6.1 | 89.4 | −738 |
| 263 | 4 | 7 | 89 | −738 |
| 264 | 3.7 | 7.6 | 88.7 | −745 |
| 265 | 4.7 | 5.7 | 89.6 | −767 |
| 266 | 4.3 | 6.6 | 89.1 | −767 |
| 267 | 3.9 | 7.8 | 88.4 | −719 |
| 268 | 6.6 | 7.5 | 86 | −767 |
| 269 | 6.7 | 10 | 83.2 | −767 |
| 270 | 6.7 | 12.5 | 80.8 | −719 |
| 271 | 15 | 12.5 | 72.5 | 155 |
| 272 | 17.5 | 19.7 | 62.8 | 600 |
| 273 | 20.6 | 29 | 50.4 | 600 |
| 274 | 20.1 | 37 | 42.9 | 600 |

TABLE 2

| Sample No. | Sn [wt %] | Fe [wt %] | Mn [wt %] | Electrochemical potential [mV] |
|---|---|---|---|---|
| 1 | 44.3 | 20.3 | 35.4 | −254 |
| 2 | 41.9 | 22.2 | 36 | −132 |
| 3 | 42.3 | 22.8 | 34.9 | −132 |
| 4 | 33.4 | 29.4 | 37.2 | −130 |
| 5 | 30.2 | 32.3 | 37.5 | −130 |
| 6 | 27.2 | 36 | 36.8 | −102 |
| 7 | 24.7 | 40 | 35.3 | −102 |
| 8 | 22.5 | 44.4 | 33.1 | −170 |
| 9 | 20.5 | 49 | 30.5 | −170 |

TABLE 2-continued

| Sample No. | Sn [wt %] | Fe [wt %] | Mn [wt %] | Electrochemical potential [mV] |
|---|---|---|---|---|
| 10 | 39 | 15.6 | 45.4 | −366 |
| 11 | 33.4 | 18.9 | 47.7 | −359 |
| 12 | 29.6 | 22.2 | 48.2 | −359 |
| 13 | 26.6 | 25 | 48.4 | −95 |
| 14 | 24.3 | 27.9 | 47.8 | −95 |
| 15 | 22.4 | 30.5 | 47.2 | −109 |
| 16 | 20 | 34 | 46 | −109 |
| 17 | 17.6 | 36.6 | 45.8 | −89 |
| 18 | 15.3 | 40 | 44.7 | −89 |
| 19 | 12.8 | 44.3 | 42.9 | −160 |
| 20 | 43.4 | 6.7 | 49.9 | −290 |
| 21 | 39.6 | 9.7 | 50.7 | −290 |
| 22 | 37.9 | 12 | 50.1 | −366 |
| 23 | 32.9 | 14.9 | 52.2 | −366 |
| 24 | 29.1 | 17.7 | 53.2 | −359 |
| 25 | 25.9 | 20.5 | 53.6 | −359 |
| 26 | 23.6 | 23.2 | 53.2 | −95 |
| 27 | 21.8 | 25.3 | 52.9 | −95 |
| 28 | 19.6 | 28.4 | 52 | −109 |
| 29 | 17.4 | 30.8 | 51.9 | −109 |
| 30 | 15.4 | 33.8 | 50.8 | −89 |
| 31 | 13.3 | 36.9 | 49.8 | −89 |
| 32 | 10.9 | 40.4 | 48.7 | −160 |
| 33 | 8.6 | 43.7 | 47.7 | −160 |
| 34 | 43.9 | 1.5 | 54.5 | −466 |
| 35 | 39.6 | 6.4 | 54 | −66 |
| 36 | 37.5 | 9 | 53.5 | −66 |
| 37 | 32.7 | 11.7 | 55.6 | −312 |
| 38 | 29.3 | 14.3 | 56.4 | −312 |
| 39 | 26.4 | 16.8 | 56.8 | −448 |
| 40 | 23.7 | 19.3 | 57 | −448 |
| 41 | 21.5 | 21.4 | 57.1 | −357 |
| 42 | 19.6 | 23.8 | 56.6 | −357 |
| 43 | 17.7 | 26.5 | 55.9 | −137 |
| 44 | 15.4 | 29.1 | 55.5 | −137 |
| 45 | 14 | 31.5 | 54.6 | 434 |
| 46 | 11.7 | 34.3 | 54 | 434 |
| 47 | 9.4 | 38.2 | 52.4 | 226 |
| 48 | 7.4 | 40.9 | 51.8 | 226 |
| 49 | 5.1 | 44.5 | 50.4 | −170 |
| 50 | 43.1 | 1.9 | 55 | −466 |
| 51 | 37.2 | 6.3 | 56.6 | −66 |
| 52 | 32.2 | 8.6 | 59.2 | −66 |
| 53 | 29.2 | 11.3 | 59.5 | −312 |
| 54 | 26.4 | 13.5 | 60 | −312 |
| 55 | 23.9 | 15.8 | 60.3 | −448 |
| 56 | 21.8 | 17.4 | 60.8 | −448 |
| 57 | 19.6 | 20.1 | 60.3 | −357 |
| 58 | 18 | 22.2 | 59.8 | −357 |
| 59 | 15.7 | 24.6 | 59.7 | −137 |
| 60 | 14 | 27.3 | 58.7 | −137 |
| 61 | 12.1 | 29.5 | 58.4 | 434 |
| 62 | 10.5 | 32.1 | 57.4 | 434 |
| 63 | 8.4 | 35.3 | 56.3 | 226 |
| 64 | 6.2 | 38.6 | 55.1 | 226 |
| 65 | 4.2 | 41.5 | 54.3 | −170 |
| 66 | 16.4 | 0.7 | 82.9 | −554 |
| 67 | 37.9 | 1.7 | 60.4 | −573 |
| 68 | 32 | 6.4 | 61.6 | −378 |
| 69 | 29 | 8.6 | 62.5 | −378 |
| 70 | 26.5 | 10.5 | 63 | −283 |
| 71 | 24.4 | 12.4 | 63.2 | −283 |
| 72 | 22.4 | 13.8 | 63.9 | −467 |
| 73 | 20.5 | 16.2 | 63.3 | −467 |
| 74 | 18.2 | 18.3 | 63.4 | −303 |
| 75 | 16.2 | 21 | 62.8 | −303 |
| 76 | 14.3 | 23 | 62.6 | −415 |
| 77 | 13 | 25.2 | 61.9 | −415 |
| 78 | 11.4 | 27.3 | 61.3 | 435 |
| 79 | 9.3 | 30.1 | 60.6 | 435 |
| 80 | 7.3 | 33 | 59.7 | 300 |
| 81 | 5.5 | 36 | 58.5 | 300 |
| 82 | 3.5 | 38.8 | 57.7 | −201 |
| 83 | 1.8 | 39.5 | 58.8 | −679 |
| 84 | 17.7 | 1 | 81.2 | −554 |
| 85 | 34.6 | 1.9 | 63.5 | −573 |
| 86 | 32.1 | 3.8 | 64.1 | −573 |
| 87 | 28.7 | 6.2 | 65.1 | −378 |
| 88 | 26.7 | 8.1 | 65.2 | −378 |
| 89 | 24.8 | 10 | 65.2 | −283 |
| 90 | 22.6 | 11.6 | 65.8 | −283 |
| 91 | 21 | 12.7 | 66.3 | −467 |
| 92 | 18.6 | 15.3 | 66.1 | −467 |
| 93 | 16.2 | 18 | 65.8 | −303 |
| 94 | 15 | 19.6 | 65.4 | −303 |
| 95 | 13.3 | 21.4 | 65.3 | −415 |
| 96 | 12.2 | 23.2 | 64.6 | −415 |
| 97 | 10.2 | 25.7 | 64.1 | 435 |
| 98 | 8.6 | 28.5 | 62.9 | 435 |
| 99 | 6.7 | 30.9 | 62.3 | 300 |
| 100 | 4.8 | 33.2 | 62 | 300 |
| 101 | 3 | 36 | 61 | −201 |
| 102 | 1.5 | 35.8 | 62.7 | −679 |
| 103 | 18.5 | 1 | 80.4 | −582 |
| 104 | 31.8 | 1.9 | 66.3 | −589 |
| 105 | 28.9 | 3.7 | 67.4 | −589 |
| 106 | 26.6 | 5.8 | 67.6 | −588 |
| 107 | 24.9 | 7.7 | 67.4 | −588 |
| 108 | 23.1 | 9.2 | 67.7 | −458 |
| 109 | 21.5 | 10.3 | 68.1 | −458 |
| 110 | 18.8 | 12.5 | 68.7 | −589 |
| 111 | 16.4 | 14.9 | 68.7 | −589 |
| 112 | 14.8 | 16.9 | 68.4 | −506 |
| 113 | 13.6 | 18.5 | 67.8 | −506 |
| 114 | 12.2 | 20.1 | 67.7 | −489 |
| 115 | 11 | 21.7 | 67.3 | −489 |
| 116 | 9.5 | 23.7 | 66.8 | 494 |
| 117 | 7.8 | 26.3 | 65.9 | 494 |
| 118 | 6.2 | 28.7 | 65.1 | −353 |
| 119 | 4.4 | 31.1 | 64.5 | −353 |
| 120 | 2.7 | 33.4 | 63.9 | −183 |
| 121 | 1.2 | 32.8 | 66 | −740 |
| 122 | 18.4 | 0.7 | 80.9 | −582 |
| 123 | 29 | 2.3 | 68.8 | −589 |
| 124 | 26.7 | 3.7 | 69.5 | −589 |
| 125 | 25.1 | 5.4 | 69.5 | −588 |
| 126 | 23.5 | 6.9 | 69.6 | −588 |
| 127 | 22 | 8 | 69.9 | −458 |
| 128 | 19.5 | 10.2 | 70.3 | −458 |
| 129 | 16.5 | 12.5 | 71 | −589 |
| 130 | 14.9 | 14 | 71.2 | −589 |
| 131 | 13.8 | 15.6 | 70.6 | −506 |
| 132 | 12.6 | 16.8 | 70.6 | −506 |
| 133 | 11.5 | 18.2 | 70.3 | −489 |
| 134 | 10.2 | 20.4 | 69.4 | −489 |
| 135 | 8.6 | 22.3 | 69.2 | 494 |
| 136 | 7.2 | 24.6 | 68.3 | 494 |
| 137 | 5.5 | 26.9 | 67.6 | −353 |
| 138 | 4 | 28.9 | 67.1 | −353 |
| 139 | 2.4 | 30.9 | 66.7 | −183 |
| 140 | 1.1 | 29.8 | 69.1 | −740 |
| 141 | 17.5 | 0.8 | 81.7 | −604 |
| 142 | 27 | 1.8 | 71.2 | −617 |
| 143 | 25 | 3.5 | 71.5 | −617 |
| 144 | 23.6 | 4.9 | 71.5 | −632 |
| 145 | 22.2 | 6.2 | 71.6 | −632 |
| 146 | 20.3 | 7.7 | 72 | −652 |
| 147 | 17.6 | 9.8 | 72.6 | −652 |
| 148 | 15.4 | 11.6 | 73 | −679 |
| 149 | 13.9 | 12.9 | 73.1 | −679 |
| 150 | 11 | 17 | 72 | −634 |
| 151 | 9.4 | 18.8 | 71.8 | −634 |
| 152 | 8.1 | 20.6 | 71.3 | −486 |
| 153 | 6.7 | 22.5 | 70.8 | −486 |
| 154 | 5.2 | 24.7 | 70 | −380 |
| 155 | 3.8 | 26.9 | 69.3 | −380 |
| 156 | 2.3 | 28.9 | 68.9 | −223 |
| 157 | 1 | 27.2 | 71.8 | −771 |
| 158 | 15.8 | 0.7 | 83.5 | −604 |
| 159 | 25.1 | 1.8 | 73.1 | −617 |
| 160 | 23.9 | 3 | 73.1 | −617 |
| 161 | 22.6 | 4.1 | 73.2 | −632 |
| 162 | 20.7 | 6.3 | 73 | −632 |
| 163 | 18.2 | 8 | 73.8 | −652 |

TABLE 2-continued

| Sample No. | Sn [wt %] | Fe [wt %] | Mn [wt %] | Electrochemical potential [mV] |
|---|---|---|---|---|
| 164 | 16.5 | 9.4 | 74.2 | −652 |
| 165 | 15 | 10.6 | 74.4 | −679 |
| 166 | 13.6 | 12.4 | 74 | −679 |
| 167 | 10.3 | 15.7 | 73.9 | −634 |
| 168 | 9.1 | 17.6 | 73.3 | −634 |
| 169 | 7.7 | 19.2 | 73.1 | −486 |
| 170 | 6.3 | 21.3 | 72.4 | −486 |
| 171 | 4.9 | 23.4 | 71.8 | −380 |
| 172 | 3.5 | 24.9 | 71.6 | −380 |
| 173 | 2.1 | 26.9 | 71 | −223 |
| 174 | 1 | 25.3 | 73.8 | −771 |
| 175 | 13.8 | 0.7 | 85.5 | −624 |
| 176 | 24.2 | 1.7 | 74.1 | −648 |
| 177 | 22.8 | 2.8 | 74.4 | −648 |
| 178 | 21.2 | 4.4 | 74.4 | −390 |
| 179 | 19.1 | 6 | 74.9 | −390 |
| 180 | 17 | 7.4 | 75.6 | −538 |
| 181 | 15.7 | 8.7 | 75.5 | −538 |
| 182 | 7.5 | 17.9 | 74.6 | −607 |
| 183 | 6.2 | 19.9 | 73.9 | −607 |
| 184 | 4.8 | 21.6 | 73.6 | −584 |
| 185 | 3.5 | 23.4 | 73.1 | −584 |
| 186 | 2.1 | 25.1 | 72.8 | −322 |
| 187 | 1.1 | 24.2 | 74.7 | −763 |
| 188 | 11.5 | 0.6 | 87.9 | −624 |
| 189 | 23.7 | 1.3 | 75 | −648 |
| 190 | 21.7 | 2.9 | 75.5 | −648 |
| 191 | 19.9 | 4 | 76.1 | −390 |
| 192 | 18.1 | 5.7 | 76.1 | −390 |
| 193 | 16.6 | 6.8 | 76.6 | −538 |
| 194 | 15.9 | 7.7 | 76.3 | −538 |
| 195 | 7.2 | 16.6 | 76.2 | −607 |
| 196 | 6.1 | 18.6 | 75.3 | −607 |
| 197 | 4.8 | 20.3 | 74.9 | −584 |
| 198 | 3.4 | 22.1 | 74.5 | −584 |
| 199 | 2.2 | 23.8 | 74 | −322 |
| 200 | 1.1 | 23.6 | 75.3 | −763 |
| 201 | 9.3 | 0.7 | 90 | −651 |
| 202 | 22.5 | 1.3 | 76.2 | −657 |
| 203 | 20.6 | 2.7 | 76.7 | −657 |
| 204 | 4.7 | 18.8 | 76.5 | −738 |
| 205 | 3.4 | 20.6 | 75.9 | −738 |
| 206 | 2.3 | 22.1 | 75.6 | −464 |
| 207 | 6.5 | 0.7 | 92.8 | −651 |
| 208 | 21.3 | 1.1 | 77.7 | −657 |
| 209 | 19.9 | 2.2 | 77.9 | −657 |
| 210 | 4.8 | 17.7 | 77.6 | −738 |
| 211 | 3.6 | 19 | 77.3 | −738 |
| 212 | 2.4 | 21 | 76.6 | −464 |
| 213 | 19.9 | 0.9 | 79.2 | −676 |
| 214 | 19.3 | 2.2 | 78.5 | −676 |
| 215 | 7.2 | 13.8 | 79 | −584 |
| 216 | 5.9 | 15.3 | 78.8 | −584 |
| 217 | 4.9 | 16.5 | 78.6 | −740 |
| 218 | 3.7 | 18.4 | 77.9 | −740 |
| 219 | 18.8 | 1.7 | 79.5 | −676 |
| 220 | 7.3 | 12.9 | 79.8 | −584 |
| 221 | 6.5 | 14.1 | 79.4 | −584 |
| 222 | 5.1 | 15.5 | 79.3 | −740 |
| 223 | 4 | 16.9 | 79.1 | −740 |

TABLE 3

| Sample No. | Cu [wt %] | Fe [wt %] | Mn [wt %] | Electrochemical potential [mV] |
|---|---|---|---|---|
| 1 | 81.8 | 6.9 | 11.3 | −266 |
| 2 | 75.3 | 9.7 | 15 | −326 |
| 3 | 68.2 | 13 | 18.8 | −326 |
| 4 | 62 | 15.8 | 22.2 | −358 |
| 5 | 55.6 | 19.5 | 24.9 | −358 |
| 6 | 51.5 | 22 | 26.5 | −486 |
| 7 | 47.5 | 25.5 | 27.1 | −486 |
| 8 | 43.8 | 29.8 | 26.4 | −460 |
| 9 | 40.7 | 33.9 | 25.4 | −460 |
| 10 | 39 | 38 | 23 | −448 |
| 11 | 35.7 | 44 | 20.3 | −448 |
| 12 | 66 | 4 | 30 | −380 |
| 13 | 61.4 | 6.1 | 32.5 | −380 |
| 14 | 56.5 | 8.8 | 34.8 | −380 |
| 15 | 51.7 | 11.1 | 37.2 | −380 |
| 16 | 47.3 | 13.7 | 39 | −390 |
| 17 | 42.8 | 16.6 | 40.6 | −390 |
| 18 | 38.6 | 19.6 | 41.7 | −519 |
| 19 | 35.6 | 22.5 | 41.9 | −519 |
| 20 | 31.4 | 25.6 | 42.9 | −479 |
| 21 | 29.1 | 28.1 | 42.8 | −479 |
| 22 | 27 | 30.8 | 42.2 | −556 |
| 23 | 24.2 | 34.7 | 41 | −556 |
| 24 | 20.7 | 38.7 | 40.6 | −332 |
| 25 | 62.2 | 2.1 | 35.7 | −192 |
| 26 | 58.3 | 4.3 | 37.4 | −380 |
| 27 | 54.1 | 6.3 | 39.6 | −380 |
| 28 | 50 | 8.6 | 41.4 | −380 |
| 29 | 45.6 | 10.8 | 43.6 | −380 |
| 30 | 40.4 | 13.8 | 45.8 | −390 |
| 31 | 37.1 | 15.7 | 47.2 | −390 |
| 32 | 33.5 | 18.8 | 47.7 | −519 |
| 33 | 30.3 | 21.3 | 48.4 | −519 |
| 34 | 27.5 | 23.9 | 48.6 | −479 |
| 35 | 25.3 | 26.6 | 48.1 | −479 |
| 36 | 22.4 | 29.3 | 48.3 | −556 |
| 37 | 20.4 | 31.8 | 47.8 | −556 |
| 38 | 17.4 | 35.6 | 47 | −332 |
| 39 | 55.2 | 0.7 | 44 | −332 |
| 40 | 56.6 | 2.4 | 41 | −388 |
| 41 | 52.8 | 4.3 | 42.9 | −388 |
| 42 | 48.9 | 6.3 | 44.8 | −475 |
| 43 | 44.2 | 8.8 | 47 | −475 |
| 44 | 40.2 | 11 | 48.9 | −594 |
| 45 | 35.6 | 13.2 | 51.2 | −594 |
| 46 | 32.5 | 15.7 | 51.9 | −617 |
| 47 | 29 | 18.3 | 52.7 | −617 |
| 48 | 26 | 20.7 | 53.2 | −588 |
| 49 | 24.4 | 22.7 | 52.9 | −588 |
| 50 | 21.6 | 25.2 | 53.2 | −584 |
| 51 | 20 | 27.5 | 52.5 | −584 |
| 52 | 16.8 | 30.7 | 52.5 | −583 |
| 53 | 14.3 | 33.6 | 52.1 | −583 |
| 54 | 13 | 36.3 | 50.7 | −549 |
| 55 | 9.9 | 40.3 | 49.8 | −549 |
| 56 | 15.3 | 0.7 | 84 | −538 |
| 57 | 53.5 | 1 | 45.5 | −170 |
| 58 | 52.1 | 2.6 | 45.2 | −388 |
| 59 | 47.8 | 4.2 | 48 | −388 |
| 60 | 44.7 | 6.4 | 49 | −475 |
| 61 | 39.8 | 8.6 | 51.6 | −475 |
| 62 | 35.5 | 10.6 | 53.9 | −594 |
| 63 | 31.7 | 12.8 | 55.5 | −594 |
| 64 | 28 | 15.2 | 56.8 | −617 |
| 65 | 25.8 | 17.2 | 56.9 | −617 |
| 66 | 23.4 | 19.5 | 57.1 | −588 |
| 67 | 21.4 | 21.2 | 57.3 | −588 |
| 68 | 19.4 | 23.7 | 56.9 | −584 |
| 69 | 17.2 | 26 | 56.7 | −584 |
| 70 | 14.5 | 28.8 | 56.6 | −583 |
| 71 | 12.8 | 31.9 | 55.4 | −583 |
| 72 | 10.5 | 34.5 | 55 | −549 |
| 73 | 8.1 | 37.4 | 54.5 | −549 |
| 74 | 18.7 | 0.9 | 80.4 | −538 |
| 75 | 50.2 | 1.1 | 48.8 | −251 |
| 76 | 47.9 | 2.5 | 49.6 | −543 |
| 77 | 43.5 | 4.2 | 52.2 | −543 |
| 78 | 39.5 | 6.5 | 54 | −636 |
| 79 | 35.2 | 8.5 | 56.3 | −636 |
| 80 | 31.2 | 10.5 | 58.3 | −654 |
| 81 | 28.1 | 12.4 | 59.5 | −654 |
| 82 | 24.7 | 14.5 | 60.8 | −655 |
| 83 | 21.7 | 16.7 | 61.6 | −655 |
| 84 | 20.8 | 18.5 | 60.6 | −644 |
| 85 | 18.6 | 20.5 | 60.9 | −644 |

TABLE 3-continued

| Sample No. | Cu [wt %] | Fe [wt %] | Mn [wt %] | Electrochemical potential [mV] |
|---|---|---|---|---|
| 86 | 17.3 | 22.4 | 60.3 | −626 |
| 87 | 14.6 | 24.7 | 60.7 | −626 |
| 88 | 13.2 | 27 | 59.8 | −601 |
| 89 | 11.1 | 29.6 | 59.2 | −601 |
| 90 | 9.5 | 32.5 | 58 | −578 |
| 91 | 6.6 | 35.3 | 58.1 | −578 |
| 92 | 4 | 37.7 | 58.3 | −567 |
| 93 | 21.5 | 0.5 | 78 | −651 |
| 94 | 46.8 | 1.2 | 52 | −251 |
| 95 | 43.6 | 3 | 53.5 | −543 |
| 96 | 39.3 | 4.5 | 56.2 | −543 |
| 97 | 35.4 | 6.3 | 58.3 | −636 |
| 98 | 31.3 | 8.3 | 60.4 | −636 |
| 99 | 27.4 | 10.2 | 62.5 | −654 |
| 100 | 23.8 | 12.2 | 64 | −654 |
| 101 | 21.4 | 14 | 64.6 | −655 |
| 102 | 19.3 | 15.3 | 65.4 | −655 |
| 103 | 17.7 | 17.4 | 65 | −644 |
| 104 | 15.6 | 19.5 | 64.9 | −644 |
| 105 | 14.8 | 20.9 | 64.3 | −626 |
| 106 | 12.9 | 23.4 | 63.7 | −626 |
| 107 | 11.4 | 25.6 | 63 | −601 |
| 108 | 10.6 | 27.7 | 61.8 | −601 |
| 109 | 8.7 | 30.1 | 61.2 | −578 |
| 110 | 5.8 | 33 | 61.2 | −578 |
| 111 | 3.1 | 34.9 | 62 | −567 |
| 112 | 23.7 | 0.6 | 75.8 | −651 |
| 113 | 43.3 | 1.1 | 55.6 | −268 |
| 114 | 39.9 | 2.9 | 57.3 | −616 |
| 115 | 35.4 | 4.4 | 60.2 | −616 |
| 116 | 32.1 | 6.1 | 61.9 | −715 |
| 117 | 27.4 | 7.9 | 64.7 | −715 |
| 118 | 23.7 | 9.5 | 66.8 | −695 |
| 119 | 20.8 | 11.4 | 67.8 | −695 |
| 120 | 17.9 | 13.3 | 68.8 | −686 |
| 121 | 16.3 | 15.1 | 68.6 | −686 |
| 122 | 14.5 | 16.8 | 68.7 | −673 |
| 123 | 13.3 | 18.3 | 68.4 | −673 |
| 124 | 12.5 | 20 | 67.5 | −654 |
| 125 | 11.3 | 21.6 | 67.1 | −654 |
| 126 | 10.7 | 23.8 | 65.5 | −626 |
| 127 | 9.6 | 25.9 | 64.5 | −626 |
| 128 | 7.4 | 28.1 | 64.5 | −608 |
| 129 | 4.9 | 30.8 | 64.3 | −608 |
| 130 | 2.6 | 31.4 | 66 | −594 |
| 131 | 23.8 | 0.5 | 75.7 | −724 |
| 132 | 40.3 | 1.2 | 58.5 | −268 |
| 133 | 36.1 | 2.6 | 61.3 | −616 |
| 134 | 32 | 4.3 | 63.7 | −616 |
| 135 | 27.7 | 6 | 66.3 | −715 |
| 136 | 24 | 7.6 | 68.4 | −715 |
| 137 | 20.5 | 9.4 | 70.1 | −695 |
| 138 | 17.8 | 11.4 | 70.9 | −695 |
| 139 | 15.6 | 12.4 | 72 | −686 |
| 140 | 13.8 | 14.3 | 71.9 | −686 |
| 141 | 11.9 | 15.9 | 72.2 | −673 |
| 142 | 11.2 | 17.2 | 71.6 | −673 |
| 143 | 10.8 | 18.8 | 70.4 | −654 |
| 144 | 9.9 | 20.2 | 69.9 | −654 |
| 145 | 9.9 | 22.1 | 68 | −626 |
| 146 | 8.6 | 24.3 | 67.1 | −626 |
| 147 | 6.5 | 26.5 | 67 | −608 |
| 148 | 4 | 29 | 67 | −608 |
| 149 | 2 | 28.4 | 69.5 | −594 |
| 150 | 22.7 | 0.6 | 76.7 | −724 |
| 151 | 36.8 | 1.3 | 61.9 | −628 |
| 152 | 32.6 | 3 | 64.4 | −716 |
| 153 | 28.3 | 4.1 | 67.7 | −716 |
| 154 | 24.6 | 5.8 | 69.6 | −752 |
| 155 | 20.6 | 7.4 | 72 | −752 |
| 156 | 18 | 8.9 | 73.1 | −730 |
| 157 | 15.2 | 10.6 | 74.2 | −730 |
| 158 | 13.7 | 11.6 | 74.7 | −714 |
| 159 | 12.1 | 13.3 | 74.6 | −714 |
| 160 | 10.6 | 14.6 | 74.9 | −695 |
| 161 | 10.4 | 16.1 | 73.5 | −695 |
| 162 | 9.7 | 17.4 | 72.9 | −675 |
| 163 | 9.3 | 19.1 | 71.7 | −675 |
| 164 | 9.1 | 20.2 | 70.7 | −652 |
| 165 | 8.2 | 22.4 | 69.4 | −652 |
| 166 | 6.1 | 24.5 | 69.4 | −638 |
| 167 | 3.7 | 27 | 69.3 | −638 |
| 168 | 1.8 | 26 | 72.1 | −625 |
| 169 | 21.2 | 0.6 | 78.2 | −773 |
| 170 | 34.2 | 1 | 64.8 | −628 |
| 171 | 29.7 | 2.5 | 67.8 | −716 |
| 172 | 25 | 4.4 | 70.6 | −716 |
| 173 | 21.7 | 5.5 | 72.8 | −752 |
| 174 | 18.4 | 7 | 74.6 | −752 |
| 175 | 16 | 8.6 | 75.3 | −730 |
| 176 | 13.7 | 9.7 | 76.6 | −730 |
| 177 | 12.3 | 11.1 | 76.6 | −714 |
| 178 | 10.5 | 12.7 | 76.8 | −714 |
| 179 | 8.9 | 14 | 77.1 | −695 |
| 180 | 8.2 | 15.2 | 76.6 | −695 |
| 181 | 8.4 | 16.5 | 75.1 | −675 |
| 182 | 8.8 | 17.6 | 73.6 | −675 |
| 183 | 8.7 | 19.1 | 72.2 | −652 |
| 184 | 7.6 | 20.9 | 71.5 | −652 |
| 185 | 5.9 | 22.7 | 71.5 | −638 |
| 186 | 3.3 | 24.8 | 71.9 | −638 |
| 187 | 1.5 | 23.9 | 74.5 | −625 |
| 188 | 17.9 | 0.6 | 81.5 | −773 |
| 189 | 31.3 | 1.1 | 67.5 | −603 |
| 190 | 27 | 2.4 | 70.6 | −792 |
| 191 | 22.6 | 3.9 | 73.5 | −792 |
| 192 | 19.7 | 5.2 | 75.1 | −788 |
| 193 | 17.2 | 6.6 | 76.2 | −788 |
| 194 | 14 | 7.8 | 78.2 | −761 |
| 195 | 12.3 | 9.3 | 78.4 | −761 |
| 196 | 10.7 | 10.5 | 78.8 | −742 |
| 197 | 9.1 | 12 | 78.8 | −742 |
| 198 | 7.9 | 13.1 | 79.1 | −714 |
| 199 | 7.5 | 14.7 | 77.9 | −714 |
| 200 | 7.7 | 15.9 | 76.3 | −704 |
| 201 | 8.2 | 16.6 | 75.1 | −704 |
| 202 | 8.4 | 17.7 | 73.8 | −678 |
| 203 | 7.3 | 19.3 | 73.3 | −678 |
| 204 | 5.4 | 21.3 | 73.2 | −659 |
| 205 | 3 | 23.5 | 73.5 | −659 |
| 206 | 1.4 | 22.6 | 76 | −643 |
| 207 | 14.8 | 0.5 | 84.6 | −763 |
| 208 | 29.1 | 1.1 | 69.8 | −603 |
| 209 | 24.7 | 2.4 | 72.8 | −792 |
| 210 | 20.6 | 3.5 | 76 | −792 |
| 211 | 17.6 | 5.2 | 77.2 | −788 |
| 212 | 14.2 | 6 | 79.8 | −788 |
| 213 | 12.9 | 7.5 | 79.7 | −761 |
| 214 | 11 | 8.5 | 80.5 | −761 |
| 215 | 9.6 | 10 | 80.4 | −742 |
| 216 | 8.5 | 11.2 | 80.2 | −742 |
| 217 | 7.3 | 12.7 | 80 | −714 |
| 218 | 7.5 | 13.6 | 78.9 | −714 |
| 219 | 6.7 | 14.9 | 78.4 | −704 |
| 220 | 7.9 | 15.5 | 76.6 | −704 |
| 221 | 8.1 | 16.7 | 75.2 | −678 |
| 222 | 7.4 | 18.2 | 74.4 | −678 |
| 223 | 5.6 | 20.2 | 74.2 | −659 |
| 224 | 2.9 | 21.9 | 75.2 | −659 |
| 225 | 1.7 | 21.6 | 76.7 | −643 |
| 226 | 11.6 | 0.3 | 88.1 | −763 |
| 227 | 27 | 0.9 | 72.1 | −816 |
| 228 | 22.8 | 2.3 | 74.9 | −825 |
| 229 | 18.2 | 3.5 | 78.3 | −825 |
| 230 | 16.5 | 4.8 | 78.8 | −810 |
| 231 | 14.1 | 6 | 79.8 | −810 |
| 232 | 11.3 | 6.9 | 81.7 | −783 |
| 233 | 10.2 | 7.9 | 81.9 | −783 |
| 234 | 8.8 | 9.2 | 82 | −762 |
| 235 | 7.6 | 10.4 | 82 | −762 |
| 236 | 7.1 | 11.6 | 81.3 | −760 |
| 237 | 7 | 12.8 | 80.3 | −760 |
| 238 | 6 | 13.8 | 80.2 | −729 |
| 239 | 7.4 | 14.6 | 78 | −729 |

TABLE 3-continued

| Sample No. | Cu [wt %] | Fe [wt %] | Mn [wt %] | Electrochemical potential [mV] |
|---|---|---|---|---|
| 240 | 7.6 | 16.1 | 76.4 | −715 |
| 241 | 7 | 17.2 | 75.8 | −715 |
| 242 | 5.2 | 18.7 | 76.1 | −678 |
| 243 | 3.1 | 20.8 | 76.1 | −678 |
| 244 | 8.7 | 0.4 | 90.9 | −663 |
| 245 | 25.1 | 1.1 | 73.9 | −816 |
| 246 | 21.4 | 2.1 | 76.5 | −825 |
| 247 | 17.4 | 3.2 | 79.4 | −825 |
| 248 | 15 | 4.3 | 80.7 | −810 |
| 249 | 12.7 | 5.5 | 81.8 | −810 |
| 250 | 10.1 | 6.8 | 83 | −783 |
| 251 | 9 | 7.7 | 83.3 | −783 |
| 252 | 8.1 | 8.5 | 83.4 | −762 |
| 253 | 6.4 | 10 | 83.6 | −762 |
| 254 | 5.8 | 10.9 | 83.3 | −760 |
| 255 | 5.9 | 11.9 | 82.2 | −760 |
| 256 | 5.6 | 13.1 | 81.3 | −729 |
| 257 | 5.5 | 14.1 | 80.4 | −729 |
| 258 | 5.7 | 15.2 | 79.1 | −715 |
| 259 | 6.3 | 16.3 | 77.4 | −715 |
| 260 | 5 | 17.6 | 77.4 | −678 |
| 261 | 3.1 | 19.5 | 77.5 | −678 |
| 262 | 23.1 | 0.6 | 76.3 | −663 |
| 263 | 20.4 | 1.9 | 77.7 | −859 |
| 264 | 16.2 | 3 | 80.8 | −859 |
| 265 | 14.2 | 4 | 81.8 | −835 |
| 266 | 10.7 | 5.3 | 84 | −835 |
| 267 | 9.2 | 6.4 | 84.4 | −819 |
| 268 | 8.2 | 7.2 | 84.6 | −819 |
| 269 | 7.2 | 8.6 | 84.2 | −773 |
| 270 | 6.5 | 9.4 | 84.1 | −773 |
| 271 | 6.1 | 10.2 | 83.7 | −755 |
| 272 | 5.4 | 11.4 | 83.2 | −755 |
| 273 | 4.8 | 12.4 | 82.8 | −744 |
| 274 | 5.3 | 13.2 | 81.5 | −744 |
| 275 | 5.6 | 14.3 | 80.1 | −726 |
| 276 | 5.4 | 15.6 | 79 | −726 |
| 277 | 4.1 | 16.9 | 79 | −702 |
| 278 | 18.9 | 1.4 | 79.7 | −702 |
| 279 | 15.7 | 2.9 | 81.4 | −859 |
| 280 | 13.3 | 3.9 | 82.8 | −835 |
| 281 | 11.6 | 4.8 | 83.6 | −835 |
| 282 | 8.8 | 6 | 85.2 | −819 |
| 283 | 8.2 | 6.9 | 84.9 | −819 |
| 284 | 6.8 | 8 | 85.3 | −773 |
| 285 | 5.9 | 9.3 | 84.8 | −773 |
| 286 | 5.2 | 10.2 | 84.6 | −755 |
| 287 | 5.4 | 10.9 | 83.7 | −755 |
| 288 | 4.3 | 11.9 | 83.8 | −744 |
| 289 | 4.8 | 12.6 | 82.7 | −744 |
| 290 | 4 | 14 | 82 | −726 |
| 291 | 4.7 | 14.9 | 80.3 | −726 |
| 292 | 4.5 | 16 | 79.5 | −702 |
| 293 | 14.9 | 2.3 | 82.8 | −702 |
| 294 | 11.5 | 3.7 | 84.8 | −858 |
| 295 | 11.1 | 4.2 | 84.7 | −858 |
| 296 | 8.6 | 5.7 | 85.8 | −824 |
| 297 | 7.6 | 6.6 | 85.8 | −824 |
| 298 | 6.2 | 7.5 | 86.3 | −802 |
| 299 | 6.2 | 8.8 | 85 | −802 |
| 300 | 5.6 | 9.7 | 84.6 | −781 |
| 301 | 5.3 | 10.5 | 84.1 | −781 |
| 302 | 4.4 | 11.5 | 84.1 | −764 |
| 303 | 4 | 12.3 | 83.7 | −764 |
| 304 | 4.6 | 13.2 | 82.2 | −751 |
| 305 | 14.2 | 3.4 | 82.5 | −751 |
| 306 | 12.8 | 4.5 | 82.6 | −858 |
| 307 | 11.7 | 5.9 | 82.4 | −824 |
| 308 | 11.9 | 7.3 | 80.8 | −824 |
| 309 | 11.9 | 8.8 | 79.3 | −802 |
| 310 | 12 | 10.2 | 77.7 | −802 |
| 311 | 11.1 | 11.5 | 77.4 | −781 |
| 312 | 9.6 | 13 | 77.4 | −781 |
| 313 | 8.4 | 13.2 | 78.4 | −764 |
| 314 | 6.8 | 13.6 | 79.6 | −764 |
| 315 | 5.7 | 13.9 | 80.4 | −751 |
| 316 | 37.8 | 8.6 | 53.5 | −751 |
| 317 | 44.4 | 11.8 | 43.9 | −672 |
| 318 | 49.2 | 16.6 | 34.2 | −475 |
| 319 | 49.3 | 21.6 | 29.1 | −475 |
| 320 | 45.9 | 25.3 | 28.8 | −450 |
| 321 | 41 | 28.4 | 30.6 | −450 |
| 322 | 35.3 | 30 | 34.7 | −486 |

TABLE 4

| Sample No. | Cr [wt %] | Fe [wt %] | Mn [wt %] | Electrochemical potential [mV] |
|---|---|---|---|---|
| 1 | 72 | 10.5 | 17.5 | −287 |
| 2 | 64.2 | 14.6 | 21.2 | −308 |
| 3 | 56.5 | 18 | 25.5 | −308 |
| 4 | 49.8 | 22 | 28.2 | −319 |
| 5 | 43.5 | 25.9 | 30.7 | −319 |
| 6 | 39.1 | 29.3 | 31.6 | −329 |
| 7 | 35.2 | 33.1 | 31.7 | −329 |
| 8 | 32.4 | 37.5 | 30.1 | −350 |
| 9 | 29.9 | 42.4 | 27.6 | −350 |
| 10 | 28 | 47.4 | 24.5 | −397 |
| 11 | 25.8 | 53.2 | 21 | −397 |
| 12 | 55.6 | 5.1 | 39.3 | −327 |
| 13 | 50.4 | 8.1 | 41.5 | −327 |
| 14 | 44.8 | 11.3 | 43.9 | −358 |
| 15 | 39.7 | 14.6 | 45.7 | −358 |
| 16 | 35.5 | 17.5 | 47 | −375 |
| 17 | 31.7 | 20 | 48.3 | −375 |
| 18 | 27.9 | 23 | 49 | −399 |
| 19 | 25.4 | 25.4 | 49.2 | −399 |
| 20 | 23 | 28.5 | 48.5 | −447 |
| 21 | 20.9 | 30.9 | 48.2 | −447 |
| 22 | 18.7 | 34.7 | 46.6 | −457 |
| 23 | 16.9 | 37.5 | 45.6 | −457 |
| 24 | 15.2 | 40.5 | 44.3 | −457 |
| 25 | 51.6 | 2.9 | 45.5 | −293 |
| 26 | 47.5 | 5.6 | 46.8 | −327 |
| 27 | 43.5 | 8.1 | 48.4 | −327 |
| 28 | 38.6 | 11.1 | 50.3 | −358 |
| 29 | 34.4 | 13.5 | 52.1 | −358 |
| 30 | 30.5 | 16 | 53.5 | −375 |
| 31 | 27.1 | 18.4 | 54.4 | −375 |
| 32 | 23.7 | 21.5 | 54.7 | −399 |
| 33 | 22.2 | 23.6 | 54.2 | −399 |
| 34 | 19.2 | 26.3 | 54.5 | −447 |
| 35 | 17.6 | 29 | 53.4 | −447 |
| 36 | 15.8 | 31.2 | 53 | −457 |
| 37 | 14.7 | 33.7 | 51.6 | −457 |
| 38 | 12.3 | 37 | 50.7 | −457 |
| 39 | 10.3 | 40.6 | 49.2 | −457 |
| 40 | 45.5 | 1.1 | 53.4 | −356 |
| 41 | 47.1 | 3.2 | 49.7 | −356 |
| 42 | 43.1 | 5.6 | 51.3 | −380 |
| 43 | 39.1 | 7.9 | 53 | −380 |
| 44 | 35.1 | 10.4 | 54.5 | −390 |
| 45 | 30.7 | 12.7 | 56.6 | −390 |
| 46 | 26.7 | 15.3 | 58 | −403 |
| 47 | 23.8 | 17.6 | 58.6 | −403 |
| 48 | 21 | 19.9 | 59.1 | −433 |
| 49 | 18.8 | 22.2 | 59 | −433 |
| 50 | 16.8 | 24.4 | 58.8 | −478 |
| 51 | 15.5 | 26.6 | 58 | −478 |
| 52 | 13.7 | 28.8 | 57.5 | −492 |
| 53 | 11.9 | 31.8 | 56.3 | −492 |
| 54 | 10.5 | 34.3 | 55.2 | −484 |
| 55 | 8.8 | 37.8 | 53.5 | −484 |
| 56 | 6.4 | 40.8 | 52.7 | −477 |
| 57 | 43.5 | 1 | 55.5 | −356 |
| 58 | 43.4 | 3.4 | 53.2 | −356 |
| 59 | 39.4 | 5.6 | 54.9 | −380 |
| 60 | 35.1 | 8 | 56.9 | −380 |
| 61 | 31.6 | 10.1 | 58.3 | −390 |
| 62 | 27.8 | 12 | 60.2 | −390 |

TABLE 4-continued

| Sample No. | Cr [wt %] | Fe [wt %] | Mn [wt %] | Electrochemical potential [mV] |
|---|---|---|---|---|
| 63 | 24.5 | 14.1 | 61.4 | −403 |
| 64 | 21.3 | 16.8 | 62 | −403 |
| 65 | 19 | 18.7 | 62.3 | −433 |
| 66 | 16.9 | 21 | 62.1 | −433 |
| 67 | 15.1 | 22.8 | 62.1 | −478 |
| 68 | 13.7 | 25 | 61.2 | −478 |
| 69 | 12.4 | 27.2 | 60.4 | −492 |
| 70 | 10.6 | 29.4 | 60 | −492 |
| 71 | 9.3 | 32.3 | 58.3 | −484 |
| 72 | 7 | 35.1 | 57.8 | −484 |
| 73 | 5.1 | 38.5 | 56.4 | −477 |
| 74 | 15.2 | 0.5 | 84.3 | −600 |
| 75 | 41 | 1.8 | 57.2 | −505 |
| 76 | 39.4 | 3.4 | 57.2 | −505 |
| 77 | 35.7 | 5.6 | 58.8 | −447 |
| 78 | 32 | 7.2 | 60.8 | −447 |
| 79 | 28.2 | 9.6 | 62.2 | −434 |
| 80 | 25.1 | 11.5 | 63.4 | −434 |
| 81 | 22.1 | 13.4 | 64.6 | −444 |
| 82 | 19.5 | 15.3 | 65.1 | −444 |
| 83 | 17.4 | 17.4 | 65.2 | −467 |
| 84 | 15.5 | 19.4 | 65.1 | −467 |
| 85 | 13.8 | 21.2 | 65 | −522 |
| 86 | 12.4 | 23.4 | 64.2 | −522 |
| 87 | 10.5 | 25.5 | 64 | −574 |
| 88 | 9.2 | 27.9 | 62.9 | −574 |
| 89 | 7.7 | 30.7 | 61.6 | −431 |
| 90 | 6.1 | 33 | 60.9 | −431 |
| 91 | 4 | 35.9 | 60.1 | −448 |
| 92 | 2.5 | 37.5 | 60 | −586 |
| 93 | 17.6 | 0.6 | 81.8 | −600 |
| 94 | 38.2 | 1.6 | 60.2 | −505 |
| 95 | 36.3 | 3.3 | 60.4 | −505 |
| 96 | 33 | 5.3 | 61.7 | −447 |
| 97 | 29.6 | 7.2 | 63.2 | −447 |
| 98 | 26.3 | 9.1 | 64.6 | −434 |
| 99 | 23.3 | 11 | 65.7 | −434 |
| 100 | 20.2 | 12.8 | 67 | −444 |
| 101 | 17.6 | 14.5 | 67.9 | −444 |
| 102 | 16.2 | 16.2 | 67.6 | −467 |
| 103 | 14.5 | 18.2 | 67.4 | −467 |
| 104 | 12.8 | 20 | 67.2 | −522 |
| 105 | 11.6 | 21.7 | 66.8 | −522 |
| 106 | 10.2 | 23.5 | 66.3 | −574 |
| 107 | 8.5 | 25.8 | 65.7 | −574 |
| 108 | 6.9 | 28.5 | 64.7 | −431 |
| 109 | 5.3 | 30.9 | 63.8 | −431 |
| 110 | 3.4 | 33.1 | 63.5 | −448 |
| 111 | 1.9 | 34.6 | 63.5 | −586 |
| 112 | 2.3 | 0.5 | 97.2 | −732 |
| 113 | 19.7 | 0.8 | 79.5 | −619 |
| 114 | 35.6 | 1.8 | 62.6 | −526 |
| 115 | 33.7 | 3.3 | 63 | −526 |
| 116 | 30.1 | 5.1 | 64.7 | −554 |
| 117 | 27 | 7.2 | 65.8 | −554 |
| 118 | 24.3 | 8.3 | 67.4 | −548 |
| 119 | 21 | 10 | 69 | −548 |
| 120 | 18.3 | 11.8 | 69.9 | −576 |
| 121 | 16.5 | 13.5 | 70 | −576 |
| 122 | 14.5 | 15.2 | 70.3 | −520 |
| 123 | 13.3 | 16.5 | 70.2 | −520 |
| 124 | 11.8 | 18.3 | 69.9 | −525 |
| 125 | 10.5 | 20 | 69.5 | −525 |
| 126 | 9.5 | 22.1 | 68.4 | −576 |
| 127 | 8.1 | 24 | 67.9 | −576 |
| 128 | 6.8 | 26.4 | 66.8 | −574 |
| 129 | 5 | 28.7 | 66.3 | −574 |
| 130 | 3.1 | 31.2 | 65.7 | −510 |
| 131 | 1.5 | 31.3 | 67.1 | −567 |
| 132 | 20.5 | 0.5 | 79 | −619 |
| 133 | 32.8 | 1.7 | 65.5 | −526 |
| 134 | 30.9 | 3.2 | 65.8 | −526 |
| 135 | 27.9 | 4.7 | 67.4 | −554 |
| 136 | 25 | 6.4 | 68.6 | −554 |
| 137 | 22.1 | 8 | 69.9 | −548 |
| 138 | 19.3 | 9.7 | 71 | −548 |
| 139 | 17.1 | 10.9 | 72 | −576 |
| 140 | 14.9 | 12.6 | 72.5 | −576 |
| 141 | 13.2 | 13.9 | 72.9 | −520 |
| 142 | 11.9 | 15.7 | 72.4 | −520 |
| 143 | 11 | 17.1 | 71.9 | −525 |
| 144 | 9.7 | 18.6 | 71.7 | −525 |
| 145 | 8.6 | 20.1 | 71.3 | −576 |
| 146 | 7.2 | 22.7 | 70 | −576 |
| 147 | 6 | 24.7 | 69.4 | −574 |
| 148 | 4.3 | 26.9 | 68.8 | −574 |
| 149 | 2.7 | 28.8 | 68.5 | −510 |
| 150 | 1.2 | 28 | 70.8 | −567 |
| 151 | 2.4 | 0.6 | 97.1 | −805 |
| 152 | 20.1 | 0.6 | 79.3 | −649 |
| 153 | 30.7 | 1.5 | 67.7 | −576 |
| 154 | 28.7 | 3.1 | 68.3 | −576 |
| 155 | 15.5 | 10.4 | 74.1 | −565 |
| 156 | 13.8 | 11.8 | 74.3 | −565 |
| 157 | 12.3 | 13 | 74.7 | −601 |
| 158 | 11.2 | 14.7 | 74.1 | −601 |
| 159 | 9.9 | 15.9 | 74.2 | −535 |
| 160 | 9 | 17.5 | 73.5 | −535 |
| 161 | 7.9 | 19.2 | 72.9 | −591 |
| 162 | 6.6 | 21 | 72.4 | −591 |
| 163 | 5.3 | 22.8 | 72 | −571 |
| 164 | 4 | 25.1 | 70.9 | −571 |
| 165 | 2.4 | 27.1 | 70.5 | −557 |
| 166 | 1.1 | 25 | 73.9 | −786 |
| 167 | 2.2 | 0.4 | 97.4 | −805 |
| 168 | 19.6 | 0.7 | 79.7 | −649 |
| 169 | 28.9 | 1.3 | 69.8 | −576 |
| 170 | 27 | 2.5 | 70.5 | −576 |
| 171 | 14.5 | 9.5 | 76 | −565 |
| 172 | 12.8 | 10.8 | 76.4 | −565 |
| 173 | 11.5 | 12.2 | 76.3 | −601 |
| 174 | 10.4 | 13.5 | 76.1 | −601 |
| 175 | 9.2 | 14.6 | 76.2 | −535 |
| 176 | 8.3 | 16.2 | 75.6 | −535 |
| 177 | 7.2 | 17.8 | 75 | −591 |
| 178 | 6.3 | 19.8 | 73.9 | −591 |
| 179 | 4.9 | 21.6 | 73.5 | −571 |
| 180 | 3.6 | 23.4 | 73 | −571 |
| 181 | 2.1 | 24.9 | 72.9 | −557 |
| 182 | 0.9 | 23 | 76.1 | −786 |
| 183 | 8.7 | 13.8 | 77.5 | −406 |
| 184 | 7.8 | 15.5 | 76.8 | −406 |
| 185 | 6.9 | 16.6 | 76.5 | −585 |
| 186 | 5.8 | 18.5 | 75.7 | −585 |
| 187 | 4.6 | 19.8 | 75.6 | −833 |
| 188 | 3.4 | 21.7 | 74.9 | −833 |
| 189 | 2.1 | 23.4 | 74.5 | −884 |
| 190 | 1 | 21.9 | 77.1 | −916 |
| 191 | 1.9 | 0.4 | 97.6 | −709 |
| 192 | 8.1 | 13.2 | 78.7 | −406 |
| 193 | 7.3 | 14.3 | 78.4 | −406 |
| 194 | 6.2 | 15.8 | 78 | −585 |
| 195 | 5.7 | 17.2 | 77 | −585 |
| 196 | 4.5 | 18.8 | 76.7 | −833 |
| 197 | 3.3 | 20.3 | 76.5 | −833 |
| 198 | 2 | 22.7 | 75.3 | −884 |
| 199 | 1 | 20.9 | 78.1 | −916 |
| 200 | 4.3 | 17.7 | 78 | −638 |
| 201 | 3.2 | 19.2 | 77.6 | −638 |
| 202 | 2 | 20.9 | 77.1 | −620 |
| 203 | 4.4 | 16.6 | 79.1 | −638 |
| 204 | 3.4 | 18.5 | 78.1 | −638 |
| 205 | 2.2 | 20 | 77.9 | −620 |
| 206 | 7.4 | 10.7 | 81.9 | 1006 |
| 207 | 6.7 | 11.6 | 81.7 | 1006 |
| 208 | 7.5 | 10.3 | 82.2 | 1006 |
| 209 | 6.8 | 11.3 | 81.9 | 1006 |
| 210 | 37 | 13.1 | 49.9 | −188 |
| 211 | 40.9 | 19.6 | 39.5 | −94 |
| 212 | 41.7 | 25.8 | 32.5 | −94 |
| 213 | 38 | 31 | 31 | −78 |
| 214 | 34.5 | 34.3 | 31.2 | −78 |
| 215 | 29.1 | 37 | 33.9 | −91 |
| 216 | 24.4 | 37 | 38.6 | −91 |

TABLE 4-continued

| Sample No. | Cr [wt %] | Fe [wt %] | Mn [wt %] | Electrochemical potential [mV] |
| --- | --- | --- | --- | --- |

TABLE 5

| Steel type | min/max | C | Si | Mn | P | S | Al | Nb | Ti | Cr + Mo | B |
| --- | --- | --- | --- | --- | --- | --- | --- | --- | --- | --- | --- |
| A | min | 0.05 | 0.05 | 0.50 | 0.000 | 0.000 | 0.015 | 0.005 | 0.000 |  | 0.0000 |
|  | max | 0.10 | 0.35 | 1.00 | 0.030 | 0.025 | 0.075 | 0.100 | 0.150 |  | 0.0050 |
| B | min | 0.05 | 0.03 | 0.50 | 0.000 | 0.000 | 0.015 | 0.005 | 0.000 |  | 0.0000 |
|  | max | 0.10 | 0.50 | 2.00 | 0.030 | 0.025 | 0.075 | 0.100 | 0.150 |  | 0.0050 |
| C | min | 0.05 | 0.05 | 1.00 | 0.000 | 0.000 | 0.015 | 0.005 | 0.000 | 0.00 | 0.0010 |
|  | max | 0.16 | 0.40 | 1.40 | 0.025 | 0.010 | 0.150 | 0.050 | 0.050 | 0.50 | 0.0050 |
| D | min | 0.10 | 0.05 | 1.00 | 0.000 | 0.000 | 0.005 |  | 0.000 | 0.00 | 0.0010 |
|  | max | 0.30 | 0.40 | 1.40 | 0.025 | 0.010 | 0.050 |  | 0.050 | 0.50 | 0.0050 |
| E | min | 0.250 | 0.10 | 1.00 | 0.000 | 0.000 | 0.015 |  | 0.000 | 0.00 | 0.0010 |
|  | max | 0.380 | 0.40 | 1.40 | 0.025 | 0.010 | 0.050 |  | 0.050 | 0.50 | 0.0500 |

The invention claimed is:

1. A steel component comprising a steel substrate having an anticorrosion coating present at least on one side of the steel substrate, the anticorrosion coating comprising a manganese-containing alloy layer, wherein the manganese-containing alloy layer forms a topmost alloy layer of the anticorrosion coating and where the manganese-containing alloy layer contacts the steel substrate and comprises:
    more than 40 wt % manganese;
    aluminum and one or more alloy elements selected from the group consisting of magnesium, calcium, strontium, zirconium, zinc, silicon, chromium, and tin, wherein a total fraction of the amount of the one or more alloy elements cumulatively is less than 2 wt %; and
    balance iron having a content less than 24 wt % and unavoidable impurities, wherein an electrochemical potential of the manganese-containing alloy layer is more negative than an electrochemical potential of the steel substrate.

2. The steel component as claimed in claim 1, wherein the amount of the difference between the electrochemical potentials of steel substrate and manganese-containing alloy layer is greater than 50 mV.

3. The steel component as claimed in claim 1, wherein the amount of the difference between the electrochemical potentials of steel substrate and manganese-containing alloy layer is greater than 150 mV.

4. The steel component as claimed in claim 1, wherein the amount of the difference between the electrochemical potentials of steel substrate and manganese-containing alloy layer is greater than 200 mV.

5. The steel component as claimed in claim 1 wherein manganese-containing alloy layer contains more than 45.2 wt % manganese.

6. The steel component as claimed in claim 5 wherein manganese-containing alloy layer contains more than 50.2 wt % manganese.

7. A flat steel product for producing, by hot forming, a steel component, the flat steel product comprising a steel substrate having an anticorrosion coating present at least on one side of the steel substrate, the anticorrosion coating comprising a manganese-containing alloy layer that forms a closest alloy layer of the anticorrosion coating to a surface of the flat steel product and where the manganese-containing alloy layer comprises:
    more than 45.2 wt % manganese;
    aluminum and one or more alloy elements selected from the group consisting of magnesium, calcium, strontium, zirconium, zinc, silicon, chromium, and tin, wherein a total fraction of the amount of aluminum and amount of the one or more alloy elements cumulatively is less than 2 wt %; and
    balance iron having a content less than 24 wt % and unavoidable impurities.

8. The flat steel product as claimed in claim 7 wherein manganese-containing alloy layer contains more than 50.2 wt % manganese.

* * * * *